(12) United States Patent
Kirihara et al.

(10) Patent No.: US 9,991,436 B2
(45) Date of Patent: Jun. 5, 2018

(54) THERMOELECTRIC CONVERTER ELEMENT, METHOD OF MANUFACTURING THERMOELECTRIC CONVERTER ELEMENT, AND THERMOELECTRIC CONVERSION METHOD

(75) Inventors: Akihiro Kirihara, Tokyo (JP);
Yasunobu Nakamura, Tokyo (JP);
Shinichi Yorozu, Tokyo (JP); Kenichi Uchida, Miyagi (JP); Eiji Saitoh, Miyagi (JP)

(73) Assignees: NEC CORPORATION, Tokyo (JP);
TOHOKU UNIVERSITY, Miyagi (JP)

(*) Notice: Subject to any disclaimer, the term of this patent is extended or adjusted under 35 U.S.C. 154(b) by 922 days.

(21) Appl. No.: 13/984,593

(22) PCT Filed: Jan. 20, 2012

(86) PCT No.: PCT/JP2012/051737
§ 371 (c)(1),
(2), (4) Date: Aug. 9, 2013

(87) PCT Pub. No.: WO2012/108276
PCT Pub. Date: Aug. 16, 2012

(65) Prior Publication Data
US 2013/0312802 A1    Nov. 28, 2013

(30) Foreign Application Priority Data

Feb. 9, 2011   (JP) .................................. 2011-025797
Sep. 5, 2011   (JP) .................................. 2011-192874

(51) Int. Cl.
*H01L 37/00*   (2006.01)
*H01L 21/00*   (2006.01)
(Continued)

(52) U.S. Cl.
CPC .............. *H01L 37/04* (2013.01); *H01L 31/18* (2013.01); *H01L 37/00* (2013.01)

(58) Field of Classification Search
CPC .......... H01L 37/04; H01L 31/18; H01L 37/00
(Continued)

(56) References Cited

U.S. PATENT DOCUMENTS

2011/0084349 A1* 4/2011 Uchida .............. C01G 49/0054
257/421

FOREIGN PATENT DOCUMENTS

CN    101133476 A    2/2008
JP    2003-92435 A    3/2003
(Continued)

OTHER PUBLICATIONS

Kurebayashi et al., "Controlled enhancement of spin-current emission by three-magnon splitting," Nature Materials 10, 660-664 (2011).*
(Continued)

*Primary Examiner* — Luan V Van
*Assistant Examiner* — Angelo Trivisonno
(74) *Attorney, Agent, or Firm* — Sughrue Mion, PLLC

(57) ABSTRACT

An object of the present invention is to provide a low-cost thermoelectric converter element having high productivity and excellent conversion efficiency. A thermoelectric converter element according to the present invention includes a substrate 4, a magnetic film 2 provided on the substrate 4 with a certain magnetization direction A and formed of a polycrystalline magnetically insulating material, and an electrode 3 provided on the magnetic film 2 with a material exhibiting a spin-orbit interaction. When a temperature gradient is applied to the magnetic film 2, a spin current is generated so as to flow from the magnetic film 2 toward the electrode 3. A current I is generated in a direction perpen-
(Continued)

dicular to the magnetization direction A of the magnetic film 2 by the inverse spin Hall effect in the electrode 3.

16 Claims, 17 Drawing Sheets

(51) Int. Cl.
H01L 35/02 (2006.01)
H01L 37/04 (2006.01)
H01L 31/18 (2006.01)

(58) Field of Classification Search
USPC .................................. 136/201, 230
See application file for complete search history.

(56) References Cited

FOREIGN PATENT DOCUMENTS

| JP | 2009-130070 A | 6/2009 | |
|----|---------------|--------|---|
| JP | 2009-295824 A | 12/2009 | |
| JP | 2010-40998 A | 2/2010 | |
| JP | 2010-191260 A | 9/2010 | |
| JP | 2010-199276 A | 9/2010 | |
| JP | 2010191260 A * | 9/2010 | |
| JP | 4457705 B2 | 4/2011 | |
| JP | 2011-249746 A | 12/2011 | |
| WO | 2009/151000 A1 | 12/2009 | |
| WO | WO 2009151000 A1 * | 12/2009 | ......... C01G 49/0054 |

OTHER PUBLICATIONS

Diniz et al., "Microscopic origin of subthermal magnons and the spin Seebeck effect," New J. Phys. 18 (2016) 052002.*
Temiryazev et al., "Excitation and Propagation of Exchange Spin Waves in Ferrite Films with Nonuniformity of Magnetic Parameters across the Film Thickness," Journal de Physique IV (Proceedings) 7(1), Feb. 1997.*
Serga et al., "YIG magnonics," J. Phys. D: Appl. Phys. 43 (2010) 264002.*
English machine translation of NAKATA (JP 2009-191260 A).*
Communication dated Jun. 3, 2015, issued by the State Intellectual Property Office of the People's Republic of China in counterpart Application No. 201280008369.6.
K. Uchida, et al., "Spin Seebeck insulator", Nature Materials, Sep. 26, 2010, pp. 894-897, vol. 9.
Ken-Ichi Uchida, et al., "Observation of longitudinal spin-Seebeck effect in magnetic insulators", Applied Physics Letters, 2010, pp. 172505-1 to 172505-3, vol. 97.
Hiroto Adachi, et al., "Gigantic enhancement of spin Seebeck effect by phonon dag", Applied Physics Letter, 2010, pp. 252506-1 to 252506-3, vol. 97.
Jun Akedo, "Aerosol Deposition and Its Application", Journal of the Surface Science Society of Japan, Aug. 9, 2004, pp. 635-641, vol. 25, No. 10.
Ken-Ichi Uchida, et al., "Longitudinal spin-Seebeck effect in sintered polycrystalline (Mn, Zn)Fe$_2$O$_4$", Applied Physics Letters, Dec. 30, 2010, pp. 262504-1 to 262504-3, vol. 97.
Communication dated Oct. 11, 2017, from the European Patent Office in counterpart European Application No. 12745161.5.
Ishibashi T et al: "(Re,Bi)$_3$(Fe,Ga)$_5$O$_{12}$ (Re=Y, Gd and Nd) thin films grown by MOD method", Journal of Crystal Growth, Elsevier, Amsterdam, NL, vol. 275, No. 1-2, Feb. 15, 2005 (Feb. 15, 2005), pp. e2427-e2431.

* cited by examiner

THERMOELECTRIC CONVERTER ELEMENT, METHOD OF MANUFACTURING THERMOELECTRIC CONVERTER ELEMENT, AND THERMOELECTRIC CONVERSION METHOD

CROSS REFERENCE TO RELATED APPLICATIONS

This application is a National Stage of International Application No. PCT/JP2012/051737, filed on Jan. 20, 2012, which claims priority from Japanese Patent Application No. 2011-025797, filed on Feb. 9, 2011 and 2011-192874, filed on Sep. 5, 2011 the contents of all of which are incorporated herein by reference in their entirety.

TECHNICAL FIELD

The present invention relates to a thermoelectric converter element using a magnetic material, a method of manufacturing a thermoelectric converter element, and a thermoelectric conversion method.

BACKGROUND OF THE INVENTION

In recent years, efforts have actively been made toward environmental issues and energy issues for the sustainable society. Expectations of thermoelectric converter elements have grown under such circumstances.

This is because heat is the most common energy source that is available from various media, such as body temperature, sunlight, engines, and industrial exhaust heat.

Therefore, thermoelectric converter elements are expected to become more important in future for efficiency enhancement in energy use for a low-carbon economy or for applications of power supply to ubiquitous terminals, sensors, or the like.

Heretofore, a bulk thermoelectric converter element comprising a thermocouple module structure assembled by processing and bonding a sintered compact of a thermoelectric semiconductor such as $Bi_2Te_3$ has commonly been used as a structure of a thermoelectric converter element. However, a thin-film thermoelectric element comprising a module produced by depositing a thin film of a thermoelectric semiconductor on a substrate by a sputtering method or the like has progressed in development and attracted attention.

Examples of the advantages of such a thin-film thermoelectric converter element are given as follows: (1) A thin-film thermoelectric converter is small in size and light in weight. (2) A collective deposition for a large area can be achieved by sputtering, coating, printing, or the like. Thus, the productivity is high. (3) Cost can be reduced by using an inexpensive substrate. (4) A flexible thermoelectric converter element can be obtained by using a highly flexible substrate.

Here, thin-film thermoelectric converter elements have heretofore been produced by coating or printing. For example, according to Patent Literature 1, powdered $Bi_2Te_3$ is mixed with a binder into paste, which is applied onto a substrate by a screen printing method or the like so as to form a thermoelectric element pattern. Furthermore, according to Patent Literature 2, an ink including a thermoelectric semiconductor material and an electrode material is pattern-printed by an ink jet method so as to form a thermoelectric element. Moreover, according to Patent Literature 3, an organic semiconductor is used as a thermoelectric material, and a thermoelectric element is formed by a printing process.

However, there has been a problem that the aforementioned thin-film thermoelectric element is so thin that it has difficulty in generating and holding a temperature difference between a front face and a rear face of the thin film. Specifically, in most of power generation applications, a temperature difference (temperature gradient) is imparted in a direction perpendicular to a thin-film surface comprising a thermoelectric material, so that thermoelectric conversion is performed. As the film thickness of a thin film of a thermoelectric semiconductor is reduced, thermal insulation (thermal resistance) becomes insufficient. Therefore, it becomes difficult to maintain a temperature difference between a front face and a rear face of the thin film of the thermoelectric semiconductor. Alternatively, a temperature difference is mostly generated between a front face and a rear face of a substrate, rather than a front face and a rear face of the thin film of the thermoelectric semiconductor. Accordingly, efficient power generation cannot be achieved.

In order to improve the thermal insulation property, one of the following two solutions may be taken: (1) The film thickness of a thermoelectric semiconductor film is increased (for example, to at least several times 10 μm). (2) The thermal conductivity of a thermoelectric semiconductor is reduced.

However, in the case of the solution (1), it becomes difficult to pattern and produce a thermocouple structure by a coating process, a printing process, or the like if the film thickness of a thermoelectric semiconductor film increases. Therefore, the productivity decreases. Thus, a trade-off arises between increased conversion efficiency and reduced cost productivity.

Furthermore, in the case of the solution (2), a material having a lower thermal conductivity tends to have a lower electric conductivity. Additionally, a thermoelectric material having a high electric conductivity is required for conventional thermoelectric generation. In view of those facts, a trade-off still arises between the electric conductivity and the thermal conductivity. Therefore, there is a limit in reduction of the thermal conductivity.

Meanwhile, in recent years, there has been discovered the spin Seebeck effect, which generates electron spin currents when a temperature gradient is applied to a magnetic material.

Patent Literature 4 and Non-Patent Literatures 1 and 2 disclose a thermoelectric converter element based upon the spin Seebeck effect and illustrate a structure in which currents of angular momentum (spin currents) caused by the spin Seebeck effect are derived as an electric current (electromotive force) by the inverse spin Hall effect.

For example, a thermoelectric converter element disclosed in Patent Literature 4 includes a ferromagnetic metal film deposited by a sputtering method and a metal electrode. With this configuration, when a temperature gradient is applied in a direction parallel to a surface of the ferromagnetic metal film, spin currents are induced along the temperature gradient by the spin Seebeck effect. The induced spin currents can be derived as an electric current to the exterior of the thermoelectric converter element by the inverse spin Hall effect of the metal electrode that is brought into contact with the ferromagnetic metal. Thus, a temperature difference power generation that derives electric power from heat can be achieved.

Furthermore, a thermoelectric converter element disclosed in Non-Patent Literatures 1 and 2 is formed of a magnetic insulator and a metal electrode.

Specifically, in Non-Patent Literature 1, there has been reported a thermoelectric conversion in which a temperature gradient is arranged in parallel to a surface of the magnetic insulator (in-plane temperature gradient) as with Patent Literature 4.

Moreover, Non-Patent Literature 2 exemplifies thermoelectric conversion with an arrangement of a temperature gradient perpendicular to a plate surface of the magnetic insulator having a thickness of 1 mm (perpendicular-plane temperature gradient).

With use of the spin Seebeck effect, a complicated thermocouple structure is not required, unlike a conventional thermoelectric converter element using a thermocouple module configuration. Therefore, the aforementioned problems relating to the arrangement patterning may be solved, and a thin-film thermoelectric converter element that can readily increase its area at a low cost may be obtained.

Furthermore, in a thermoelectric converter element using the spin Seebeck effect, an electrically conductive portion (electrode) and a thermally conductive portion (magnetic material) can be designed independently of each other. In theory, a structure having a high electric conductivity (low ohmic loss) and a low thermal conductivity (capable of holding a temperature difference between a front face and a rear face thereof) can be implemented.

For example, when an insulation material is used for a magnetic material as in Non-Patent Literatures 1 and 2, heat conduction through electrons can completely be inhibited. Therefore, development of a high-performance thermoelectric converter element that can achieve sufficient thermal insulation with a thin-film material is anticipated.

Patent Literature 5 discloses the following structure. Two metal electrodes are provided on a magnetic and dielectric layer. Spin currents induced in one of the electrodes by signal currents are exchanged with spins in the magnetic and dielectric layer to generate spin currents of spin waves and propagate them through the magnetic and dielectric layer. The spin currents of spin waves and pure spin waves are exchanged with each other at an interface between the other electrode and the magnetic and dielectric layer to thereby generate signal power on the other electrode. Thus, signal currents are transmitted between the two electrodes (Patent Literature 5).

PRIOR ART LITERATURES

Patent Literature(s)

Patent Literature 1: JP-B 4457705
Patent Literature 2: JP-A 2010-40998
Patent Literature 3: JP-A 2010-199276
Patent Literature 4: JP-A 2009-130070
Patent Literature 5: JP-A 2009-295824

Non-Patent Literature(s)

Non-Patent Literature 1: Uchida et al., "Spin Seebeck insulator," Nature Materials, 2010, vol. 9, p. 894.
Non-Patent Literature 2: Uchida et al., "Observation of longitudinal spin-Seebeck effect in magnetic insulators," Applied Physics Letters, 2010, vol. 97, p. 172505.

SUMMARY OF THE INVENTION

Problem(s) to be Solved by the Invention

The structure of a thermoelectric converter element using the spin Seebeck effect as disclosed in Patent Literature 4 and Non-Patent Literatures 1 and 2 is advantageous in that it can readily increase its area at a low cost and can achieve thin-film thermoelectric conversion.

Meanwhile, a conventional thermoelectric converter element using the spin Seebeck effect employs a ferromagnetic metal for a magnetic material serving as a heat conduction portion in Patent Literature 4 or employs monocrystalline garnet (magnetic insulator) in Non-Patent Literatures 1 and 2.

However, it is difficult to obtain a low thermal conductivity in the case of a metal in which conduction electrons carry heat or in the case of a monocrystalline insulator having good crystallinity and demonstrating good phonon conduction. Therefore, it is difficult to hold a temperature difference between a front face and a rear face of the element. Thus, there is still room for improvement in enhancing the performance of thermoelectric conversion.

For example, when a monocrystalline thin film as disclosed in Non-Patent Literature 1 is used, an arrangement of a temperature gradient perpendicular to a surface of the thin film (perpendicular-plane temperature gradient) cannot achieve sufficient thermal insulation. Therefore, it has been difficult to put highly-efficient thermoelectric power generation into practice. Additionally, film deposition by liquid phase epitaxial growth (LPE), laser ablation (PLD), or the like is needed to obtain monocrystal. Therefore, there is room for improvement in consideration of applications of element production processes that achieves high productivity at a low cost, such as deposition on a flexible substrate with a large area, high-speed thickness increase, and high-speed multilayering.

Furthermore, use of a bulk magnetic material in the form of a thick plate as in Non-Patent Literature 2 enables practical thermoelectric power generation with a perpendicular-plane temperature gradient. However, because of lowered productivity of production processes or increased material cost, there is still room for improvement to achieve a low-cost and large area element.

Meanwhile, the structure of Patent Literature 5 does not relate to a thermoelectric converter element. Therefore, as a matter of course, Patent Literature 5 fails to disclose any problems or solutions on the cost, productivity, and enhancement of the performance of a thermoelectric converter element.

The present invention has been made in view of the above drawbacks. It is, therefore, an object of the present invention to provide a low-cost thermoelectric converter element having high productivity and excellent conversion efficiency.

Means for Solving the Problem(s)

In order to achieve the aforementioned object, according to a first aspect of the present invention, a thermoelectric converter element is characterized by comprising a substrate, a magnetic film provided on the substrate with a certain magnetization direction and formed of a polycrystalline magnetically insulating material, and an electrode provided on the magnetic film with a material exhibiting a spin-orbit interaction.

According to a second aspect of the present invention, a method of manufacturing a thermoelectric converter element is characterized by applying a solution containing a magnetic material on a substrate, heating the substrate to sinter the magnetic material, and depositing an electrode on the magnetic material so as to produce the thermoelectric converter element as recited in the first aspect.

According to a third aspect of the present invention, a method of manufacturing a thermoelectric converter element is characterized by blowing particles containing a magnetic material onto a substrate by an aerosol deposition method to form a magnetic film and depositing an electrode on the magnetic film so as to produce the thermoelectric converter element as recited in the first aspect.

According to a fourth aspect of the present invention, a thermoelectric conversion method is characterized by applying a temperature gradient to the magnetic film of the thermoelectric converter element as recited in the first aspect to generate a spin current flowing from the magnetic film toward the electrode and generating a current in a direction perpendicular to the magnetization direction of the magnetic film by an inverse spin Hall effect in the electrode.

According to a fifth aspect of the present invention, a thermoelectric conversion method is characterized by applying a temperature difference while using, for a low-temperature side, a side of the substrate of the thermoelectric converter element as recited in the first aspect on which the magnetic film is provided and using another side of the substrate for a high-temperature side.

Advantageous Effects of the Invention

According to the present invention, there can be provided a low-cost thermoelectric converter element having high productivity and excellent conversion efficiency.

BRIEF DESCRIPTION OF DRAWINGS

FIG. 7 is a perspective view showing a thermoelectric converter element 1a.

FIG. 16 illustrates a case where YIG was doped with no impurity.

FIG. 17 illustrates a case where YIG was doped with an impurity such that the composition became $Bi_{0.5}Y_{2.5}Fe_5O_{12}$.

FIG. 18 illustrates a case where YIG was doped with an impurity such that the composition became $BiY_2Fe_5O_{12}$.

FIG. 24 models an image in a case where particulates were perpendicularly incident.

FIG. 26 models an image in a case where particulates were incident in an inclined state of 25 degrees from the vertical position (the state shown in FIG. 25).

MODE(S) FOR CARRYING OUT THE INVENTION

Preferred embodiments of the present invention will be described in detail below based upon the drawings.

First, a first embodiment of the present invention will be described in detail with reference to FIGS. 1 to 6.

Figure 1:
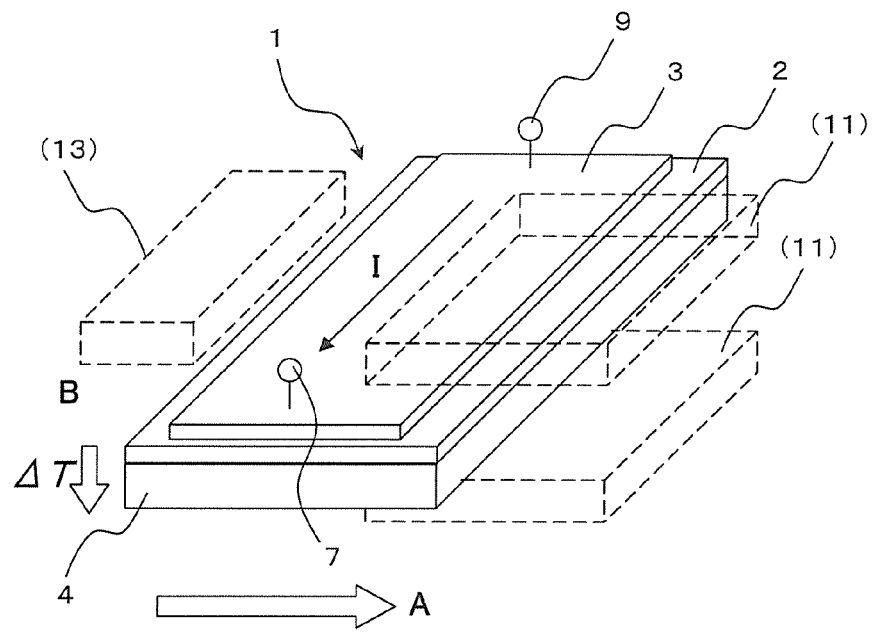
FIG. 1 is a perspective view showing a thermoelectric converter element 1.

As shown in FIG. 1, a thermoelectric converter element 1 comprises a substrate 4, a magnetic film 2 held on the substrate 4 for generating spin currents from a temperature gradient, and an electrode 3 provided on the magnetic film 2 for deriving a thermoelectromotive force from the spin currents using the inverse spin Hall effect.

Furthermore, the thermoelectric converter element 1 is formed such that terminals 7 and 9 for deriving a thermoelectromotive force can be mounted on two points of the electrode 3. Those terminals 7 and 9 constitute a thermoelectromotive force output portion.

Moreover, the thermoelectric converter element 1 has a temperature gradient application portion 11, as needed, for providing a temperature gradient to the magnetic film 2.

Furthermore, the thermoelectric converter element 1 comprises a magnetization portion 13, as needed, for magnetizing the magnetic film 2.

The substrate 4 is not limited to any specific material or structure as long as it can support the magnetic film 2 and the electrode 3. For example, the substrate 4 may use a substrate made of a material such as Si, glass, alumina, sapphire, gadolinium gallium garnet (GGG), or polyimide. The shape of the substrate 4 does not need to be a plate-like shape, and the substrate 4 may comprise a structure having curves or unevenness. Furthermore, a building or the like may directly be used as the substrate 4.

The magnetic film 2 includes a polycrystalline magnetic material having at least one magnetization direction A. The first embodiment assumes that the magnetic film 2 has magnetization in one direction parallel to its film surface (the magnetization direction has at least a component parallel to the film surface). The magnetic film 2 exhibits thermoelectric effects more efficiently if it is made of a material having a lower thermal conductivity. Therefore, it is preferable to use a magnetic insulator for the magnetic film 2. For example, magnetic oxides such as garnet ferrite (yttrium iron ferrite) or spinel ferrite may be applied to such a material.

A material in which an impurity such as Bi has been substituted for part of yttrium sites of garnet ferrite may be used for the magnetic film 2. The matching of energy levels between the magnetic film 2 and the electrode 3 will be improved when an impurity is substituted for yttrium sites. Therefore, it may be possible to increase the efficiency of deriving spin currents at an interface and thus improve the thermoelectric conversion efficiency.

One of specific examples of the composition is yttrium iron garnet doped with Bi represented by $Bi_xY_{3-x}Fe_5O_{12}$ ($0.5 \leq x \leq 1.5$).

Doping elements are not limited to Bi and may be any other impurity as long as the impurity can improve the matching of energy levels between the magnetic film 2 and the electrode 3.

Methods of forming the magnetic film 2 includes methods of depositing the magnetic film 2 on the substrate 4 by using a sputtering method, a metal organic decomposition method (MOD method), a sol-gel method, an aerosol deposition method (AD method), or the like. Among others, an AD method is preferable for such a deposition method.

This is because an AD method performs formation and densification of a polycrystal film by collision energy of particulates, thus less depends upon substrates as compared to other deposition methods, and can also achieve deposition on a metal film.

Furthermore, the film thickness that can be deposited by usual deposition methods such as a sputtering method or an MOD method is about 1 μm at maximum. In contrast, use of an AD method allows high-speed deposition of a thick film of 10 μm or more. A film with a film thickness around the characteristic thickness $t_c$, which will be described later, can be formed in a short period of time. In addition, high-speed area enlargement can be achieved by two-dimensional scan of a nozzle. Therefore, it is possible to implement a thermoelectric converter element having a larger area at a lower cost.

The electrode 3 includes a material that exhibits the spin-orbit interaction in order to obtain thermoelectromotive forces with use of the inverse spin Hall effect. Examples of such a material include metals that exhibit a relatively high degree of the spin-orbit interaction, such as Au, Pt, or Pd, and alloys containing such metals. In order to enhance the inverse spin Hall effect, a material produced by adding an impurity such as Fe or Cu to the aforementioned metals or alloys may be used as the material of the electrode 3. The same effects can be attained when a general metal film material, such as Cu, is doped with a material such as Au, Pt, Pd, or Ir at only about 0.5% to about 10%.

The electrode 3 is formed on the magnetic film 2 through deposition by a sputtering method, a vapor deposition method, a plating method, a screen printing method, or the like. It is preferable to set the thickness of the electrode to be at least a spin diffusion length of the material of the electrode. Specifically, for example, it is preferable to set thickness of the electrode to be at least 50 nm for Au and at least 10 nm for Pt.

The structure, shape, and location of the terminals 7 and 9 are not specifically limited as long as the terminals 7 and 9 can be used to obtain a potential difference between those terminals as a thermoelectromotive force. In order to maximize a potential difference, it is preferable to provide the terminals 7 and 9 on two opposite ends of the magnetic film 2 in a direction perpendicular to the magnetization direction A (so that a line connecting between the terminals 7 and 9 is perpendicular to the magnetization direction A) as shown in FIG. 1.

The temperature gradient application portion 11 can be anything that can apply a temperature gradient to the magnetic film 2. Various kinds of heaters or heat conductors for transferring heat of body temperature, sunlight, engines, industrial exhaust heat, or the like may be used for the temperature gradient application portion 11. In FIG. 1, the temperature gradient application portion 11 is configured so as to apply a temperature gradient in a direction perpendicular to a film direction of the magnetic film 2 (i.e., to apply a temperature gradient having a component perpendicular to the film direction of the magnetic film 2).

The temperature gradient application portion 11 is not necessarily be required if the heat source transfers heat directly to the magnetic film.

The magnetization portion 13 is a device for magnetizing the magnetic film 2 in the magnetization direction A. The structure, material, and kind of the magnetization portion 13 are not specifically limited as long as the magnetization portion 13 can hold the magnetization of the magnetic film 2. Specifically, for example, a magnetic field generation device using a coil or the like may be used as the magnetization portion 13, or a magnet or the like may be brought close to the magnetic film 2 as the magnetization portion 13. Alternatively, another ferromagnetic film or another antiferromagnetic film may be disposed close to the magnetic film 2 so as to hold the magnetization of the magnetic film 2 with use of the magnetic interaction.

Next, an operation of the thermoelectric converter element 1 will briefly be described below.

First, in the thermoelectric converter element 1 of FIG. 1, a magnetic field is applied to the magnetic film 2 with use of the magnetization portion 13 to magnetize the magnetic film 2 in the magnetization direction A. Subsequently, a temperature gradient is applied with use of the temperature gradient application portion 11 so as to form a temperature gradient in a direction perpendicular to the film surface of the magnetic film 2 (in the direction B of FIG. 1).

Then currents of angular momentum (spin currents) are induced in this direction of the temperature gradient by the spin Seebeck effect in the magnetic film 2.

The spin currents generated in the magnetic film 2 flow into the adjacent electrode 3, so that the inverse spin Hall effect in the electrode 3 converts the spin currents into a current I that flows in a direction perpendicular to the magnetization direction A of the magnetic film 2.

This current I generates a potential difference between the terminals 7 and 9. The potential difference can be derived as a thermoelectromotive force from the terminals 7 and 9.

Specifically, the thermoelectric converter element 1 generates a thermoelectromotive force from a temperature difference (temperature gradient) applied to the magnetic film 2.

Here, the thickness of the magnetic film 2 and the substrate 4 determines the conversion efficiency of the thermoelectric converter element 1 as described below and thus preferably has the value described below.

First, the thickness of the magnetic film 2 will be described below.

Figure 2:
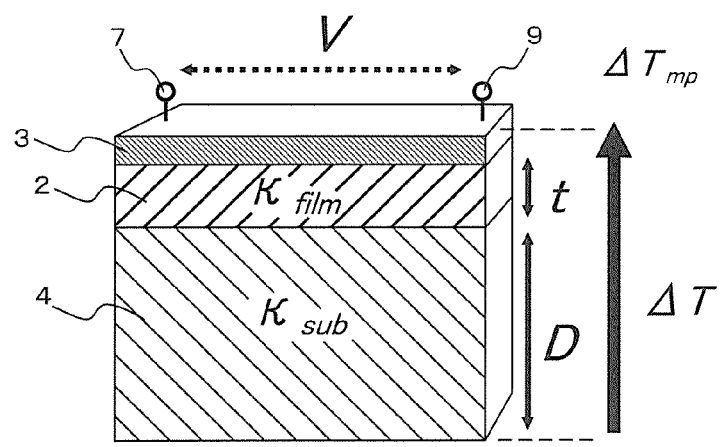
FIG. 2 is a cross-sectional view of the thermoelectric converter element 1.

When a certain temperature difference (temperature gradient) is applied to an upper surface and a lower surface (front face and rear face) of the thermoelectric converter element 1 comprising a configuration as illustrated in FIG. 2, a thermoelectromotive force (output voltage of the terminals 7 and 9 of the electrode 3 that is generated by the temperature gradient) V increases approximately linearly with respect to the film thickness t of the magnetic film 2 up to a certain characteristic thickness.

Specifically, as the film thickness t of the magnetic film 2 increases, the thermoelectromotive force V increases in proportion to the film thickness t.

However, if the film thickness t of the magnetic film 2 exceeds a certain characteristic thickness $t_c$, this linear relationship does not hold so that the thermoelectromotive force V becomes saturated with respect to the film thickness t.

Specifically, referring to the theory of the spin Seebeck effect (Reference: Physical Review B 81, 214418), an output voltage V of the thermoelectric converter element 1 is in proportion to a difference $\Delta T_{mp}$ between the lattice temperature $T_{phonon}$ (temperature in the ordinary meaning) at an interface between the magnetic film 2 and the electrode 3 and the magnon temperature $T_{magnon}$ (effective temperature describing the thermal fluctuation of magnetization) as given by the following formula (1).

$$V \propto \Delta T_{mp} = T_{phonon} - T_{magnon} \quad (1)$$

This lattice-magnon temperature difference $\Delta T_{mp}$ at the interface is approximately represented by the following formula (2) where t is the film thickness of the magnetic film 2, and D is the film thickness of the substrate 4. It is assumed that the film thickness of the electrode 3 is much smaller than t or D and is thus neglected. In the formula (2), $\kappa_{film}$ and $\kappa_{sub}$ represent the thermal conductivity of the magnetic film 2 and the substrate 4, respectively, and λ represents the magnon diffusion length (length scale in which magnetic excitation is diffused) in the magnetic film 2. Some monocrystalline magnetic insulators have such a long magnon diffusion length that λ exceeds 1 mm In cases of polycrystalline magnetic insulators, the magnon diffusion length also depends upon the crystallinity, so that λ is conceivably shorter than that of monocrystalline magnetic insulators. Furthermore, ΔT represents a temperature difference applied to the upper and lower surfaces of the thermoelectric converter element 1, i.e., a temperature difference applied between a lower surface of the substrate 4 (a surface on which the magnetic film 2 is not deposited) and an upper surface of the electrode 3 (a surface adjacent to the magnetic film 2).

$$\Delta T_{mp} \approx \frac{1}{\frac{t}{\lambda}\coth\frac{t}{2\lambda}} \cdot \frac{\frac{t}{\kappa_{film}}}{\frac{t}{\kappa_{film}} + \frac{D}{\kappa_{sub}}} \Delta T \qquad (2)$$

Figure 3:
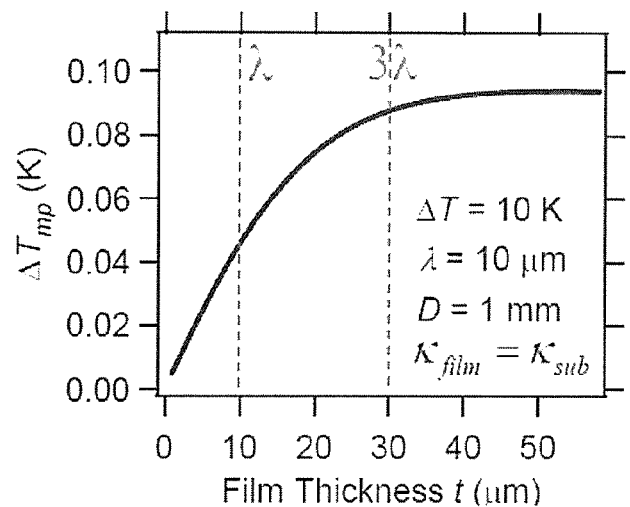
FIG. 3 is a specific example of calculation of the dependency of a lattice-magnon temperature difference $\Delta T_{mp}$ in the thermoelectric converter element 1 upon a magnetic material film thickness t in a case where a magnon diffusion length $\lambda=10$ μm, a substrate thickness $D=1$ mm, a temperature difference between an upper surface and a lower surface of the element $\Delta T=10$ K, and a thermal conductivity $\kappa_{sub}$ of the substrate 4 was equal to a thermal conductivity $\kappa_{film}$ of the magnetic film 2 ($\kappa_{film}=\kappa_{sub}$).

FIG. 3 shows a specific example of calculation for the dependency of the lattice-magnon temperature difference $\Delta T_{mp}$ upon the thickness t of the magnetic material film in a case where the magnon diffusion length λ=10 μm, the thickness of the substrate D=1 mm, the temperature difference ΔT between the upper and lower surfaces of the element=10 K, and the thermal conductivity $\kappa_{film}=\kappa_{sub}$. In a range where t is small, $\Delta T_{mp}$ is proportional to t. If t exceeds λ (=10 μm), an increase of $\Delta T_{mp}$ is gradually lessened and saturated approximately when t=3λ=30 μm. The thermoelectromotive force V is proportional to this $\Delta T_{mp}$. Therefore, even if the thickness of the magnetic material film is further increased, the thermoelectromotive force (output voltage) does not increase.

Figure 4:
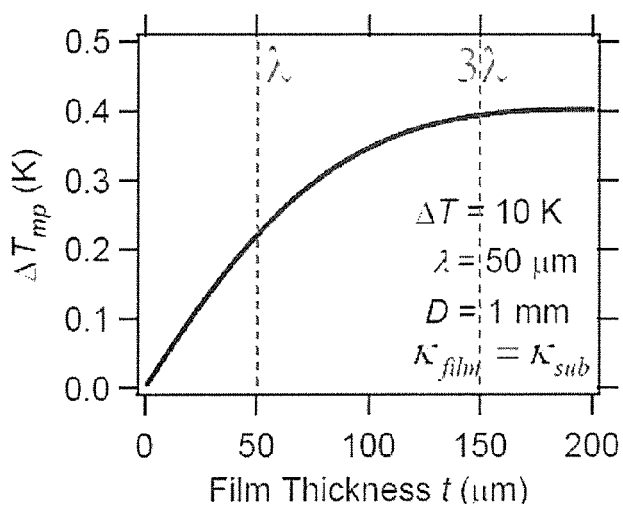
FIG. 4 is a specific example of calculation of the dependency of $\Delta T_{mp}$ upon the magnetic material film thickness in a case where the magnon diffusion length $\lambda=50$ μm in FIG. 3.

Similarly, FIG. 4 shows the dependency of $\Delta T_{mp}$ on t in a case where the magnon diffusion length λ=50 μm. Other conditions such as the thickness of the substrate were the same as those in FIG. 3. In this case, when t exceeds λ (=50 μm), an increase of $\Delta T_{mp}$ is gradually lessened and saturated approximately when t=3λ=150 μm. Thus, the thermoelectromotive force (output voltage) V does not increase any more.

Accordingly, in this case, the aforementioned characteristic thickness $t_c$, i.e., the thickness $t_c$ of the magnetic material film at which the thermoelectromotive force is saturated under the conditions of a constant temperature difference applied between the upper and lower surface of the element, can be defined so that $t_c=3\lambda$.

However, the characteristic thickness $t_c$ at which the thermoelectromotive force is saturated may not be determined merely by the magnon diffusion length λ in a case where there are other energy relaxation factors or in a case of an element structure in which another degree of freedom such as phonons is involved.

The foregoing is summarized as follows: From the viewpoint of higher efficiency and lower cost, the film thickness t of the magnetic film 2 should preferably be set to be about the characteristic thickness $t_c$ at which the output voltage V is saturated along with an increased thickness of the magnetic material film.

Nevertheless, for an application in which reduction of variations in element performance due to fluctuation of the film thickness of the magnetic material is important, such as an application for a large-area deposition, it is preferable to design an element with a relatively large film thickness of the magnetic material with which the thermoelectromotive force is almost saturated. From this point of view, the thickness t of the magnetic material film should preferably be set to be at least $t_c$ at which the thermoelectromotive force V is substantially saturated.

Meanwhile, in view of material saving (i.e., cost reduction), the film thickness at which the output is completely saturated may be derived from the calculation results of FIGS. 3 and 4. As a result, it is preferable to set the thickness t of the magnetic material film to be not more than $5t_c$.

In this manner, in consideration of power generation use in which highly efficient conversion is of importance, the film thickness t of the magnetic film 2 is preferably in a range between $t_c/5$ and $5t_c$ in order to achieve possible conversion performances.

Next, the thickness of the substrate 4 will be described below.

The lattice-magnon temperature difference $\Delta T_{mp}$ at the interface between the magnetic film 2 and the electrode 3 (and the thermoelectromotive force V proportional to $\Delta T_{mp}$) depends not only upon the magnetic film 2, but also upon parameters of the substrate 4. The following description assumes an example under conditions that the magnon diffusion length λ=50 μm (the characteristic thickness $t_c$=150 μm), the magnetic material film thickness t=50 μm, and the temperature difference between the upper and lower surfaces of the element ΔT=10 K, and examines the dependency of the lattice-magnon temperature difference $\Delta T_{mp}$ of the thermoelectric converter element 1 upon some substrate parameters.

Figure 5:
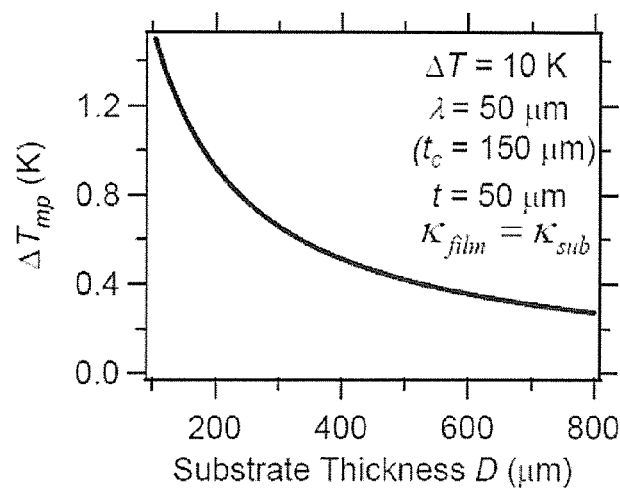
FIG. 5 is a graph showing the dependency of the lattice-magnon temperature difference $\Delta T_{mp}$ in the thermoelectric converter element 1 upon the substrate thickness D in a case where the thermal conductivity $\kappa_{sub}$ of the substrate 4 was equal to the thermal conductivity $\kappa_{film}$ of the magnetic film 2 ($\kappa_{film}=\kappa_{sub}$).

First, FIG. 5 shows the dependency of the lattice-magnon temperature difference $\Delta T_{mp}$ upon the thickness D of the substrate in a case where the thermal conductivity $\kappa_{sub}$ of the substrate 4 was equal to the thermal conductivity $\kappa_{film}$ of the magnetic film 2 ($\kappa_{film}=\kappa_{sub}$). As shown in FIG. 5, under the conditions that the temperature difference ΔT between the upper and lower surfaces of the element is held constant, a temperature difference applied to a portion of the magnetic film 2 (i.e., a temperature gradient in the magnetic film 2) increases as the thickness D of the substrate 4 is reduced. As a result, the lattice-magnon temperature difference $\Delta T_{mp}$ increases at the interface between the magnetic film 2 and the electrode 3. In other words, as the thickness D of the substrate 4 is smaller, the resultant thermoelectromotive force V becomes larger.

Figure 6:
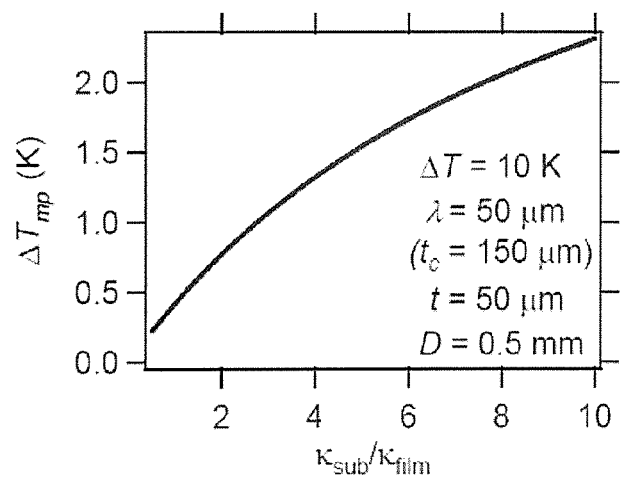
FIG. 6 is a graph showing the dependency of the lattice-magnon temperature difference $\Delta T_{mp}$ in the thermoelectric converter element 1 upon a ratio "$\kappa_{sub}/\kappa_{film}$" of the thermal conductivity of the substrate 4 to the thermal conductivity of the magnetic film 2.

Under the same conditions that the magnon diffusion length λ=50 μm (the characteristic thickness $t_c$=150 μm), the magnetic material film thickness t=50 μm, and the temperature difference between the upper and lower surfaces of the element ΔT=10 K, now the thickness of the substrate is fixed so that D=0.5 mm. In this case, effects of the thermal conductivity $\kappa_{sub}$ of the substrate 4 are examined. FIG. 6 shows the dependency of the lattice-magnon temperature difference $\Delta T_{mp}$ upon the "ratio $\kappa_{sub}/\kappa_{film}$ of the thermal conductivity of the substrate 4 to the thermal conductivity of the magnetic film 2." As shown in FIG. 6, under the condition that the temperature difference ΔT between the upper and lower surfaces of the element is held constant, the temperature difference applied to a portion of the magnetic film 2 (i.e., the temperature gradient in the magnetic film 2) increases as the thermal conductivity $\kappa_{sub}$ of the substrate 4 is increased. As a result, the lattice-magnon temperature difference $\Delta T_{mp}$ increases at the interface between the magnetic film 2 and the electrode 3. In other words, as the thermal conductivity $\kappa_{sub}$ of the substrate 4 is higher as compared to the thermal conductivity $\kappa_{film}$ of the magnetic film 2, the resultant thermoelectromotive force V becomes larger.

In this manner, the thickness D of the substrate 4 should preferably be as small as possible in order to obtain a larger thermoelectromotive force. The thermal conductivity $\kappa_{sub}$ of the substrate 4 should preferably be higher than the thermal conductivity $\kappa_{film}$ of the magnetic film 2.

However, if the thickness D of the substrate 4 is extremely small or the thermal conductivity $\kappa_{sub}$ of the substrate 4 is extremely high in practical thermoelectric power generation, then it may be difficult to hold the temperature difference ΔT between the upper and lower surfaces of the element.

Furthermore, in some applications, the thickness of the substrate should be increased to a certain degree in order to ensure the reliability of the element. Therefore, those substrate parameters should properly be designed in consideration of the balance between the thermoelectromotive force and the temperature difference ΔT, required strength of the element, and the like.

According to FIG. 6, when the thermal conductivity $\kappa_{sub}$ of the substrate 4 is held constant, a larger thermoelectromotive force V can be obtained as the thermal conductivity $\kappa_{film}$ of the magnetic film 2 is lowered. According to the present invention, the magnetic film 2 is formed of a polycrystalline insulator. Therefore, the crystallinity of the magnetic film 2 can be controlled by a production method of the magnetic film 2. Accordingly, a higher output of thermoelectric conversion can be achieved by optimizing the crystallinity of the magnetic film 2 so as to suppress phonon conduction.

In this manner, according to the first embodiment, the thermoelectric converter element 1 includes the substrate 4, the magnetic film 2 provided on the substrate 4 with a certain magnetization direction A and formed of a polycrystalline magnetically insulating material, and the electrode 3 provided on the magnetic film 2 with a material exhibiting the spin-orbit interaction. When a temperature gradient is applied to the magnetic film 2, spin currents are generated so as to flow from the magnetic film 2 toward the electrode 3. Thus, a current I is generated in a direction perpendicular to the magnetization direction A of the magnetic film 2 by the inverse spin Hall effect in the electrode 3.

Therefore, there can be provided a thermoelectric converter element that can achieve both of high efficiency and low cost.

Specifically, since the magnetic film 2 is formed of a polycrystalline magnetically insulating thin film, it can be deposited on a larger area at a low cost with high production efficiency by using a coating or printing process. Furthermore, polycrystalline magnetic insulators can remarkably suppress both of heat conduction by electrons and heat conduction by phonons, unlike metals, semiconductors, and monocrystalline magnetic insulators. Therefore, even a thin film of a polycrystalline magnetic insulator has high thermal insulation properties. In other words, a polycrystalline magnetic insulator has such properties that it is unlikely to release heat and can readily hold a temperature difference between the front face and the rear face of the thermoelectric converter element.

Next, a second embodiment of the present invention will be described in detail below with reference to FIG. 7.

In the second embodiment, a material having coercivity is used as the magnetic film 12 of the first embodiment.

In the second embodiment, components having the same functions as those in the first embodiment are denoted by the same reference numerals. Thus, the following description focuses on differences between the second embodiment and the first embodiment.

Figure 7:
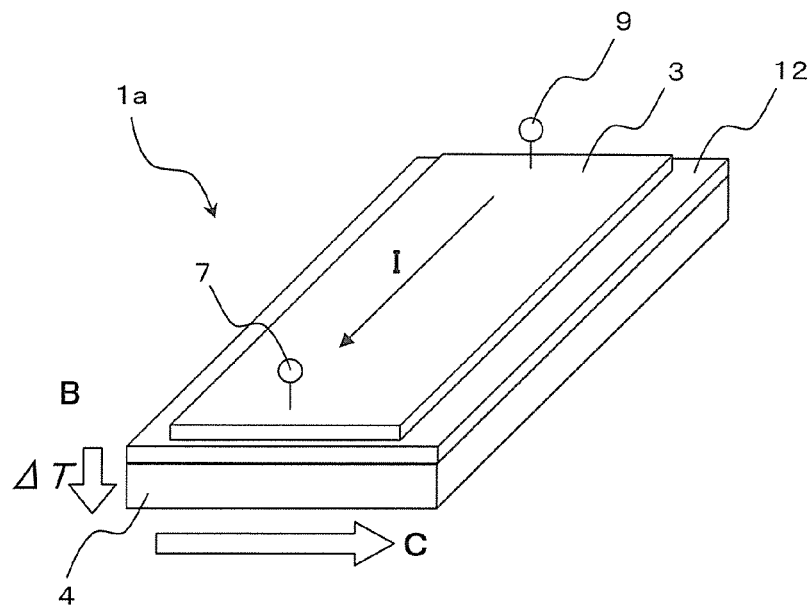

As shown in FIG. 7, a thermoelectric converter element 1a comprises a substrate 4, a magnetic film 12 held on the substrate 4, and an electrode 3 provided on the magnetic film 12.

The magnetic film 12 is a material having coercivity in a magnetization direction C (a direction perpendicular to the film thickness direction in this example). A magnetic field was applied to the magnetic film 12 with use of the magnetization portion 13 (see FIG. 1) or the like, so that the magnetic film 12 has been magnetized in the magnetization direction C.

In this manner, use of a pre-magnetized material as the magnetic film 12 allows the magnetic film 12 to hold spontaneous magnetization in the magnetization direction C. Therefore, a thermoelectromotive force can be generated by the spontaneous magnetization of the magnetic film 12 even in an environment of zero magnetic field in which no magnetic field is applied from the exterior of the element.

Furthermore, once the magnetic film 12 has spontaneous magnetization, the magnetization portion 13 (see FIG. 1) becomes unnecessary.

Specific materials for the magnetic film 12 include a material produced by substituting an impurity for part of the iron sites of garnet ferrite to enhance the coercivity.

In this manner, according to the second embodiment, the thermoelectric converter element 1a includes the substrate 4, the magnetic film 12 provided on the substrate 4 with a certain magnetization direction C and formed of a polycrystalline magnetically insulating material, and the electrode 3 provided on the magnetic film 12 with a material exhibiting the spin-orbit interaction. When a temperature gradient is applied to the magnetic film 12, spin currents are generated so as to flow from the magnetic film 12 toward the electrode 3. Thus, a current I is generated in a direction perpendicular to the magnetization direction C of the magnetic film 12 by the inverse spin Hall effect in the electrode 3.

Accordingly, the second embodiment exhibits the same advantageous effects as the first embodiment.

Furthermore, according to the second embodiment, the magnetic film 12 has coercivity in the magnetization direction C.

Therefore, no application of an external magnetic field is necessary upon the thermoelectric conversion. Accordingly, there can be provided a thermoelectric converter element that can achieve higher efficiency and lower cost as compared to the thermoelectric converter element of the first embodiment.

Next, a third embodiment of the present invention will be described in detail below with reference to FIG. 8.

In the third embodiment, multiple sets of the magnetic films 2 and the electrodes 3 of the first embodiment are stacked.

In the third embodiment, components having the same functions as those in the first embodiment are denoted by the same reference numerals. Thus, the following description focuses on differences between the third embodiment and the first embodiment.

Figure 8:
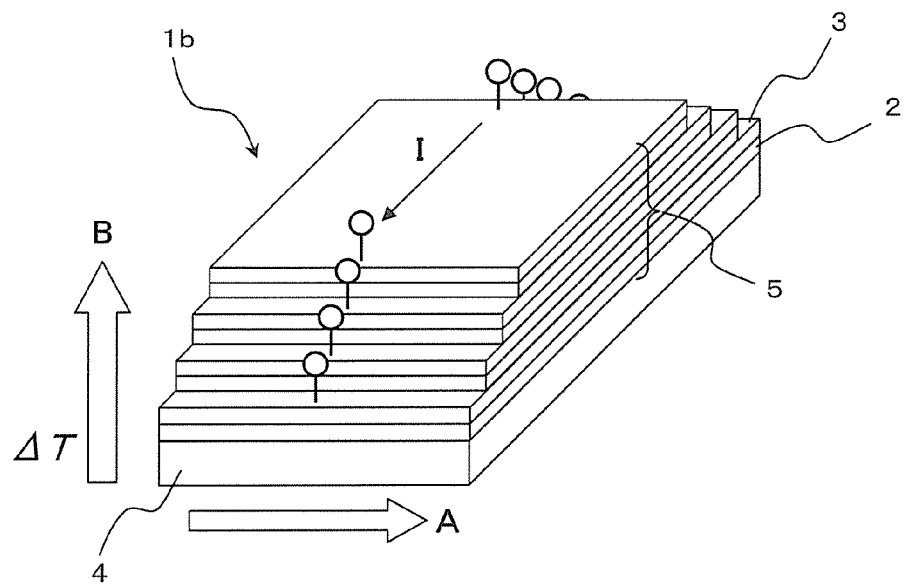
FIG. 8 is a perspective view showing a thermoelectric converter element 1b.

As shown in FIG. 8, a thermoelectric converter element 1b comprises a substrate 4 and a power generation portion 5 held on the substrate 4 in which magnetic films 2 and electrodes 3 are alternately stacked.

In this manner, the magnetic films 2 and the electrodes 3 are alternately stacked. Therefore, a thermoelectromotive force V can be derived from each of the stacked electrodes 3. Furthermore, when those electrodes 3 are connected in series to sum the thermoelectromotive forces V, a large thermoelectromotive force $V_{total}$ can be obtained as a whole.

The magnetic films 2 may be formed of a material having coercivity as with the magnetic film 12 of the second embodiment. In such a case, the thermoelectric converter element 1b can generate power by the spontaneous magnetization of the magnetic films 12 even in an environment having no external magnetic field.

Furthermore, a spacer layer may be interposed in the above stacking structure as needed. For example, non-magnetic insulator such as a $SiO_2$ layer may be used as the spacer layer. Moreover, when polyolefin such as polyethylene and polypropylene or polyester such as PET (PolyEthylene Terephthalate) and PEN (PolyEthylene Naphthalate) is used for the spacer layer, the spacer layer can be formed by a printing process.

Here, one of such multilayered thermoelectric converter elements has been known as a conventional thermoelectric converter element based upon a thermocouple, for example, as disclosed in JP-A 2003-92435. However, the objectives and advantageous effects of the thermoelectric converter element 1b according to the third embodiment are essentially different from those of the conventional thermoelectric converter element.

Specifically, the conventional multilayered thermoelectric converter element primarily aims at "improvement of the user's convenience" and "optimization of the performance" by stacking a plurality of thermoelectric materials having different optimal operational temperatures so as to enable power generation in a wide temperature range from a high temperature to a low temperature. Conversely, the multilayering is not so effective in a case where the power generation performance of thermoelectric materials does not depend so much upon the temperature or in a case where a temperature range to be used is limited. In other words, when the thickness of thermoelectric modules or the temperature difference to be applied is the same, a module using a thick single layer of a thermoelectric material and a module stacking a plurality of thin thermoelectric materials do not make much difference in thermoelectric conversion efficiency.

In contrast, according to a thermoelectric converter element of the present invention, the thermoelectromotive force is saturated if the magnetic film 2 has a thickness greater than a certain value, or a "characteristic thickness $t_c$." An element formed by stacking a plurality of thin magnetic films 2 having a thickness not more than the characteristic thickness $t_c$ and electrodes 3 can demonstrate higher thermoelectric conversion performance, as a whole, than an element formed of a single layer of a magnetic film 2 having a thickness not less than the characteristic thickness $t_c$ and an electrode 3.

Therefore, the preferable design guidelines for a thermoelectric converter element of the third embodiment are as follows: (1) First, the film thickness of the substrate 4 and the power generation portion 5 that is required for a specific application is designed. (In order to hold a temperature difference for thermoelectric power generation, an element requires a certain minimum film thickness. Furthermore, the thickness of the substrate 4 or the like is determined upon the required reliability or durability. Depending upon the application, the substrate 4 may be made as thin as possible, or an element may be formed without use of the substrate 4.) (2) Next, the design film thickness required in the power generation portion 5 is compared to the characteristic thickness $t_c$ of the magnetic material. (2A) If the design film thickness of the power generation portion 5 is not more than the characteristic thickness $t_c$, then the power generation portion 5 is formed by a single layer of a magnetic film 2 and an electrode 3. (2B) If the design film thickness of the power generation portion 5 is not less than the characteristic thickness $t_c$, then the power generation portion 5 is formed by stacking a plurality of magnetic films 2 and electrodes 3. (3) In the case where the power generation portion 5 is multilayered as in (2B), the film thickness of the magnetic film 2 in each of the layers should preferably set to be not more than the characteristic thickness $t_c$ in view of higher efficiency. Nevertheless, the number of manufacturing processes increases when many thin magnetic films are stacked. Therefore, it is the most preferable to set the film thickness of the magnetic film 2 in each of the layers to be about the characteristic thickness $t_c$ in consideration of simplification of the manufacturing processes.

With the above design, the most efficient thermoelectric conversion can be achieved under conditions for a specific application or power generation.

In this manner, according to the third embodiment, the thermoelectric converter element 1b includes the substrate 4, the magnetic films 2 provided on the substrate 4 with a certain magnetization direction A and formed of a polycrystalline magnetically insulating material, and electrodes 3 provided on the magnetic films 2 with a material exhibiting the spin-orbit interaction. When a temperature gradient is applied to the magnetic films 2, spin currents are generated so as to flow from the magnetic films 2 toward the electrodes 3. Thus, a current I is generated in a direction perpendicular to the magnetization direction A of the magnetic films 2 by the inverse spin Hall effect in the electrodes 3.

Accordingly, the third embodiment exhibits the same advantageous effects as the first embodiment.

Furthermore, according to the third embodiment, the thermoelectric converter element 1b comprises the power generation portion 5 in which the magnetic films 12 and the electrodes 3 are alternately stacked on each other.

Therefore, a thermoelectromotive force V can be derived from each of the stacked electrodes 3. Furthermore, when those electrodes 3 are connected in series to sum the thermoelectromotive forces V, a large thermoelectromotive force $V_{total}$ can be obtained as a whole.

EXAMPLES

The present invention will be described in greater detail based upon some examples.

Example 1

A thermoelectric converter element 1 according to the first embodiment was produced, and a thermoelectromotive force of the thermoelectric converter element 1 was evaluated. Specific procedures were as follows.
<Production of a Sample>

Figure 9:
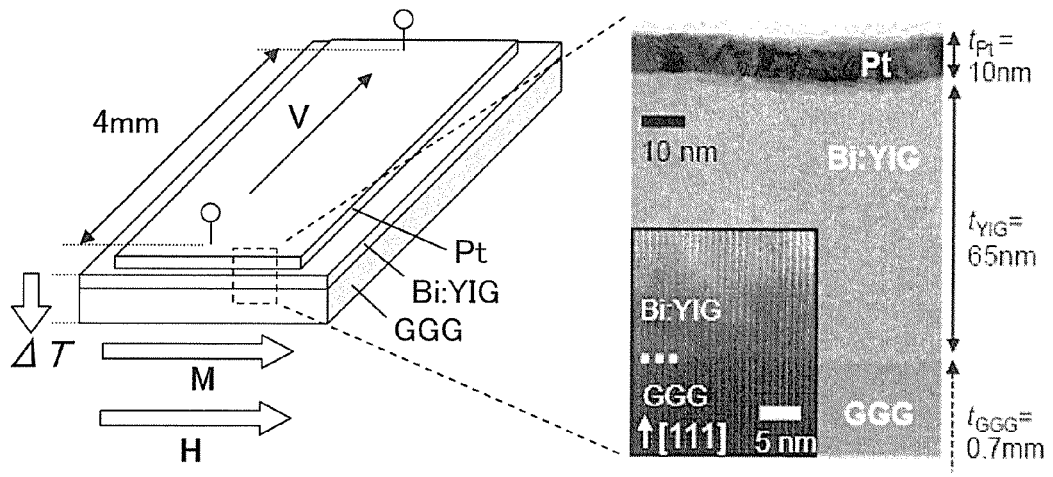
FIG. 9 is a diagram modeling a perspective view of a sample of Example 1 and a TEM (transmission electron microscope) image of a cross-section of the sample.

FIG. 9 shows an example of the thermoelectric converter element produced. A substrate (111) surface of gadolinium gallium garnet (with composition of $Gd_3Ga_5O_{12}$; hereinafter referred to as "GGG") manufactured by Saint-Gobain K. K. was prepared. The thickness of the substrate was 0.7 mm, and the substrate had a rectangular shape with planar dimension of 2 mm×4 mm Then a film of yttrium iron garnet (with composition of $BiY_2Fe_5O_{12}$; hereinafter referred to as "Bi:YIG") in which Bi had been substituted for part of the Y sites was deposited as a magnetic film 2 on the GGG substrate by a metal organic decomposition method (MOD method).

Specifically, a MOD solution with a mole fraction of Bi:Y:Fe=1:2:5 that had been manufactured by Kojundo Chemical Lab. Co., Ltd. was used. (Within this solution, raw metal materials were dissolved in acetic ester at a concentration of 3%.) (1) First, this solution was applied onto the GGG substrate at a revolving speed of 1,000 rpm for 30 seconds by a spin-coating method. (2) The GGG substrate was dried with a hot plate of 150° C. for 5 minutes. (3) Then the GGG substrate was heated at 550° C. in an electric furnace for 5 minutes and thus temporarily sintered. (4)

Finally, the GGG substrate was sintered at 720° C. in the same electric furnace for 14 hours. Thus, a Bi:YIG film having a film thickness of about 65 nm was formed on the GGG substrate.

Next, a Pt electrode having a film thickness of 10 nm was deposited as an electrode 3 on the Bi:YIG film by a sputtering method. Thus, a thermoelectric converter element 1 was completed. A distance between the terminals 7 and 9 of the electrode 3 was set to be 4 mm A cross-section of the complete thermoelectric converter element 1 was observed with use of a transmission electron microscope (TEM). As a result, it was confirmed that a crystalline film of Bi:YIG that had less defects or grain boundaries was formed so as to achieve lattice matching with the GGG (111) surface as shown in FIG. 9.

<Evaluation of the Thermoelectromotive Force>

Next, a varying magnetic field H was applied to the produced sample within a range of −120 Oe to +120 Oe (1 Oe=79.577 A/m) with use of an electromagnet. Furthermore, a heat sink made of Cu was provided on one of an upper end and a lower end of the thermoelectric converter element 1, which was used for a low-temperature side. A heater was provided on the other end of the thermoelectric converter element 1, which was used for a high-temperature side. Temperature differences $\Delta T=1$ K, 2 K, and 3 K were applied, and voltages (thermoelectromotive forces) V between the terminals 7 and 9 of the electrode 3 were measured.

Figure 10:
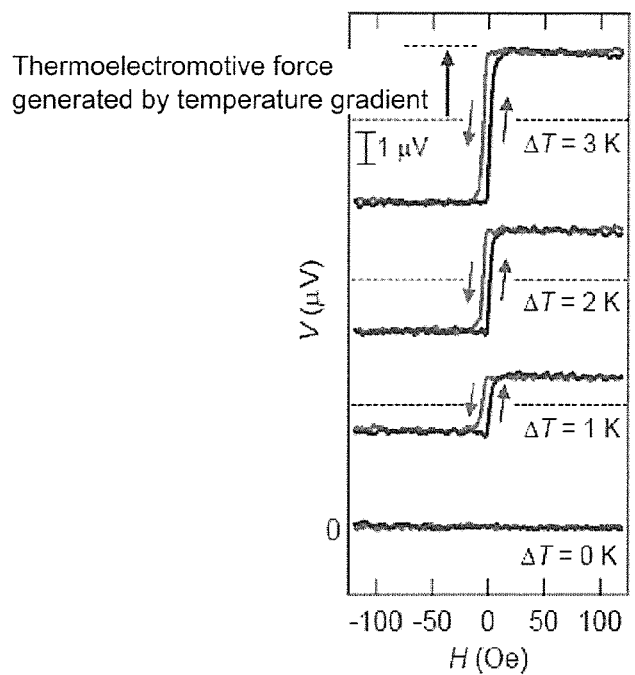
FIG. 10 is a graph showing the relationship between the magnetic field and the thermoelectromotive force in the sample of Example 1, illustrating a case where temperature differences (temperature gradients) $\Delta T=1$ K, 2 K, and 3 K were applied to an upper surface and a lower surface of the thermoelectric converter element 1 and a case where no temperature difference was applied to the upper and lower surfaces of the thermoelectric converter element 1 ($\Delta T=0$ K).
Figure 11:
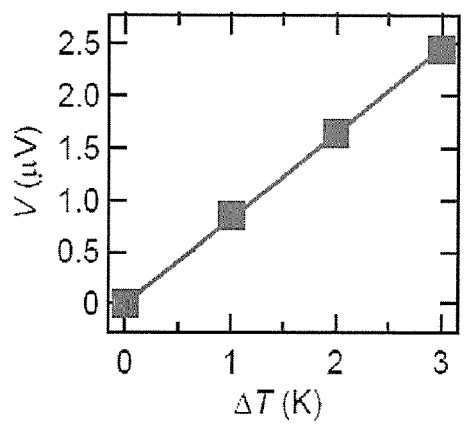
FIG. 11 is a graph showing the relationship between the temperature difference $\Delta T$ and the thermoelectromotive force in the sample of Example 1.

FIG. 10 shows the relationship between the magnetic field and the thermoelectromotive force of the thermoelectric converter element 1, and FIG. 11 shows the relationship between the temperature difference $\Delta T$ and the thermoelectromotive force of the thermoelectric converter element 1.

As is apparent from FIG. 10, the magnetic field H served to reverse the magnetization of the magnetic film 2. Thus, it was found that the sign of the thermoelectromotive force V is reversed by the reversed magnetization.

Furthermore, as shown in FIG. 11, it was found that the thermoelectromotive force V increases in proportion to $\Delta T$.

<Evaluation of Dependency of the Thermoelectromotive Force Upon the Film Thickness by Control of the Spin-Coat Revolving Speed>

Next, the revolving speed of the spin-coating application described in the above (1) was varied in a range of 1,000 rpm to 5,000 rpm so as to vary the film thickness $t_{YIG}$ of the magnetic film 2. Then the dependency of the thermoelectromotive force of the element upon the film thickness was examined. For production, the element was dried with a hot plate at 150° C. for 5 minutes after the spin-coating process. Then the element was heated at 550° C. in an electric furnace for 5 minutes and thus temporarily sintered. Finally, the element was sintered at 720° C. in the same electric furnace for 4 hours.

Figure 12:
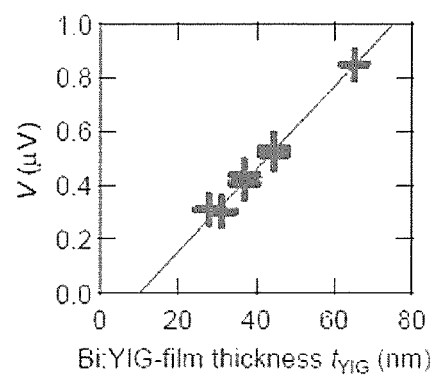
FIG. 12 is a graph showing the dependency of the thermoelectromotive force upon the film thickness in a case where the film thickness of the sample of Example 1 was varied by changing a revolving speed of the magnetic material at the time of spin-coat deposition.

For evaluation of the thermoelectromotive force, while a magnetic field H was varied in a range of −120 Oe to +120 Oe (1 Oe=79.577 A/m), a thermoelectromotive force was measured in a state in which the temperature difference was fixed so that $\Delta T=3$ K. Thus, the dependency of the thermoelectromotive force upon the film thickness (of the magnetic film 2) was measured. FIG. 12 shows the results plotting thermoelectromotive forces with the horizontal axis representing the film thickness $t_{YIG}$ of Bi:YIG. It was seen that the thermoelectromotive force V increased substantially in proportion to the film thickness $t_{YIG}$ of the magnetic film 2.

<Evaluation of Dependency of the Thermoelectromotive Force Upon the Film Thickness by Overlay Coating of an MOD Solution>

Next, the revolving speed of the spin-coating application was set to be 1,000 rpm, and an MOD solution was overlaid a plurality of times. Thus, those experiments were conducted to vary the film thickness of the magnetic film 2. Specifically, the processes of (1) spin-coating, (2) drying at 170° C., and (3) temporarily sintering at 550° C. were repeated N times (N=1 to 3) so as to form a thick film. Finally, sintering at 680° C. for 14 hours was conducted to form a Bi:YIG magnetic film.

Figure 13:
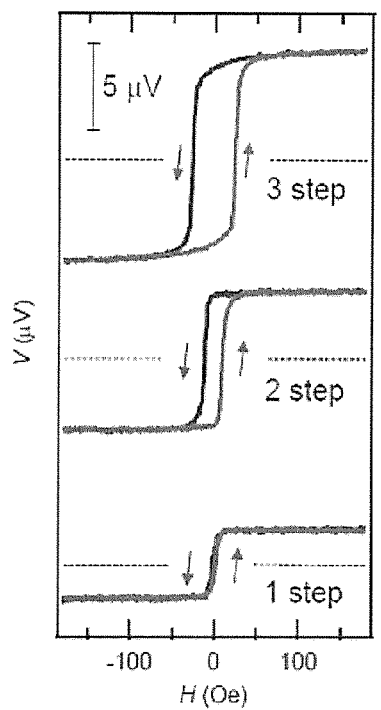
FIG. 13 is a graph showing the relationship between the external magnetic field and the thermoelectromotive force of samples produced by single, double, and triple overlay coatings of a MOD solution (metal organic decomposition solution) on the sample of Example 1, in which "step" represents the number of overlay coatings conducted.
Figure 14:
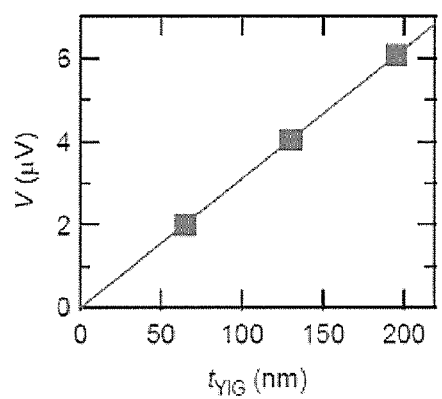
FIG. 14 is a graph showing the relationship between the film thickness and the thermoelectromotive force of samples produced by single, double, and triple overlay coatings of a MOD solution (metal organic decomposition solution) on the sample of Example 1.

FIGS. 13 and 14 show the evaluation results of the thermoelectric conversion characteristics of this element.

FIG. 13 shows the thermoelectromotive forces of the element subjected to single, double, and triple overlay coatings with the horizontal axis representing the external magnetic field H. On the other hand, FIG. 14 shows the measurement results of the same thermoelectromotive forces with the horizontal axis representing the film thickness. Those results revealed that the overlay coating doubles and triples the film thickness and that the thermoelectromotive force also increases in proportion to the increased film thickness.

FIGS. 13 and 14 only show the results of the experiments where the number of overlay coatings N was up to three. However, even if N is not less than three, the similar effects of a thermoelectromotive force increased by an increased film thickness are anticipated.

As shown by a series of experiments described above, when the magnetic material film thickness t ($t_{YIG}$) is less than the characteristic thickness $t_c$ ($t<t_c$), an increased output of the thermoelectric converter element can be achieved by increasing the film thickness of the magnetic material with control of the revolving speed of the spin-coating for application and deposition, overlay coating, or the like.

<Evaluation of Doping an Impurity of Bi>

Figure 15:
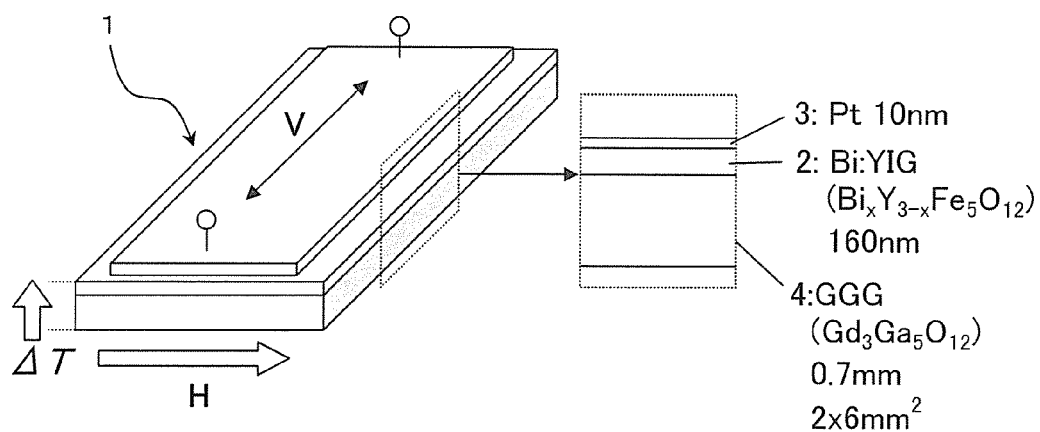
FIG. 15 is a schematic view of a thermoelectric converter element using a magnetic film 2 in which YIG ($Y_3Fe_5O_{12}$) is doped with a different amount of an impurity of bismuth (Bi) (Bi is substituted for the Y sites).

Next, a thermoelectric converter element 1 comprising a structure shown in FIG. 15 was produced. The relationship between the amount of a doping impurity of bismuth (Bi) in Bi:YIG used for the magnetic film 2 and the thermoelectromotive force was evaluated. Specific procedures were as follows.

First, a GGG substrate having a thickness of 0.7 mm and a planar dimension of 2 mm×6 mm was prepared as a substrate 4, and Bi:YIG in which YIG ($Y_3Fe_5O_{12}$) had been doped with different amounts of an impurity of bismuth (Bi) (Bi had been substituted for the Y sites) was deposited as a magnetic film 2 on the substrate 4.

Specifically, Bi:YIG having three types of composition $Bi_xY_{3-x}Fe_5O_{12}$ where x=0, x=0.5, and x=1.0 was deposited with a thickness of 160 nm under sintering conditions of 720° C. and 14 hours by a metal organic decomposition method (MOD method).

Next, a Pt electrode was deposited as an electrode 3 so as to have a film thickness of 10 nm by a sputtering method. Thus, samples were completed.

Then a varying magnetic field H was applied to those samples within a range of −120 Oe to +120 Oe (1 Oe=79.577 A/m). The thermoelectromotive force was measured in a state in which the temperature difference was fixed so that $\Delta T=3$ K. Thus, the dependency of the thermoelectromotive force upon the amount of doping impurity was evaluated.

Figure 16:
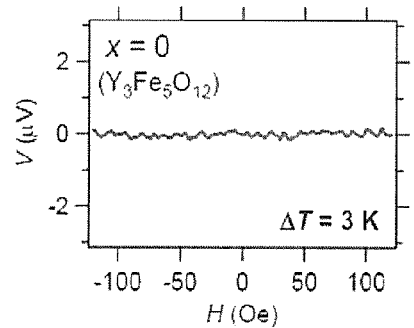
FIG. 16 is a graph showing the dependency of a thermoelectromotive force in a thermoelectric converter element using a magnetic film 2 in which YIG ($Y_3Fe_5O_{12}$) was doped with a different amount of an impurity of bismuth (Bi) (Bi was substituted for the Y sites), upon the amount of doping impurity.
Figure 17:
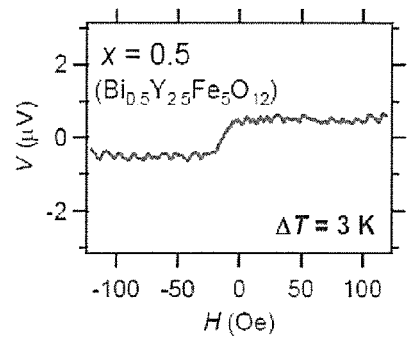
FIG. 17 is a graph showing the dependency of a thermoelectromotive force in a thermoelectric converter element using a magnetic film 2 in which YIG ($Y_3Fe_5O_{12}$) was doped with a different amount of an impurity of bismuth (Bi) (Bi was substituted for the Y sites), upon the amount of doping impurity.
Figure 18:
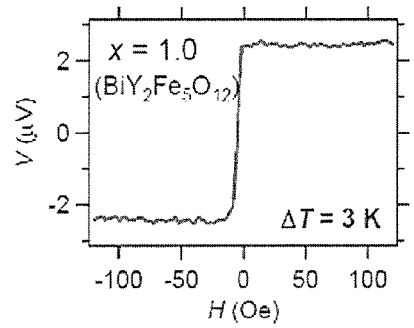
FIG. 18 is a graph showing the dependency of a thermoelectromotive force in a thermoelectric converter element using a magnetic film 2 in which YIG ($Y_3Fe_5O_{12}$) was doped with a different amount of an impurity of bismuth (Bi) (Bi was substituted for the Y sites), upon the amount of doping impurity.

The results are shown in FIGS. 16 to 18.

As is apparent from FIGS. 16 to 18, the thermoelectric conversion performance was greatly improved by substituting bismuth (Bi) for the sites of yttrium (Y). This is conceivably because the matching of energy levels between the magnetic film 2 and the electrode 3 (Pt) was improved by substituting bismuth (Bi) for the yttrium (Y) sites, so that the derivation efficiency of spin currents at an interface between the magnetic film 2 and the electrode 3 was increased.

From the above results, it was found that it is preferable to use, as the magnetic film 2, a YIG film ($Bi_xY_{3-x}Fe_5O_{12}$) in which an impurity of Bi has been doped, in order to achieve an increased efficiency of thermoelectric conversion.

From the results shown in FIGS. 16 to 18, the doping amount x should preferably satisfy that x≥0.5. However, if the amount of doping Bi is excessively increased, the magnetic film may become unstable. Therefore, it is preferable to satisfy that 0.5≤x≤1.5.

<Evaluation of Doping Effects of Impurities other than Bi>

From the above experiments, effects of enhancing the thermoelectromotive force through Bi doping were confirmed. Here, thermoelectric converter elements using YIG in which YIG had been doped with an impurity other than Bi were also evaluated. Specific procedures were as follows.

First, GGG substrates each having a thickness of 0.7 mm and a planar dimension of 2 mm×6 mm were prepared as substrates 4, and magnetic films 2 of X:YIG in which YIG ($Y_3Fe_5O_{12}$) had been doped with three different impurities X (X=Bi, Ce, and La) were respectively deposited on the substrates 4. The impurity X was substituted for the yttrium (Y) sites of YIG so as to form a composition of ($XY_2$)$Fe_5O_{12}$.

One of specific deposition methods is as follows: X:YIG was deposited with a thickness of 65 nm under sintering conditions of 680° C. and 14 hours in the same manner as described above by a metal organic decomposition method (MOD method). Then a Pt electrode was deposited as an electrode 3 so as to have a film thickness of 10 nm by a sputtering method. Thus, samples were completed.

Then a varying magnetic field H was applied to those samples within a range of −180 Oe to +180 Oe (1 Oe=79.577 A/m). The thermoelectromotive force was measured in a state in which the temperature difference was fixed so that ΔT=16.5 K. Thus, the dependency of the thermoelectromotive force upon the amount of doping impurity was evaluated.

Figure 19:
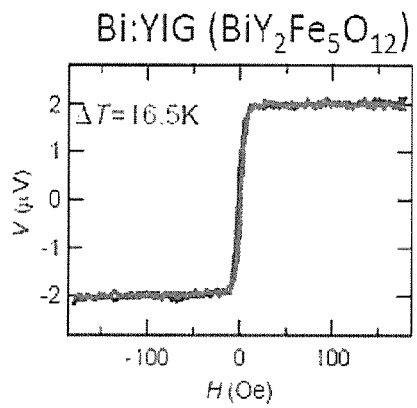
FIG. 19 is a graph showing the relationship between an external magnetic field and a thermoelectromotive force of a thermoelectric converter element using a magnetic film 2 in which an impurity of Bi was added to YIG ($Y_3Fe_5O_{12}$) such that the composition became ($BiY_2Fe_5O_{12}$).
Figure 20:
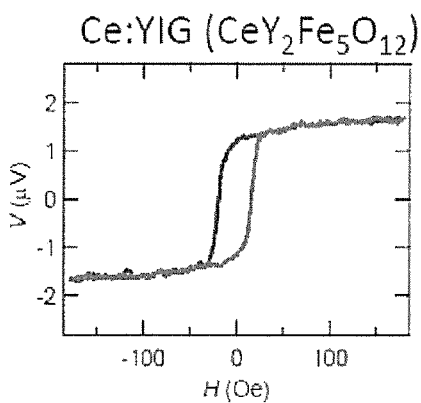
FIG. 20 is a graph showing the relationship between an external magnetic field and a thermoelectromotive force of a thermoelectric converter element using a magnetic film 2 in which an impurity of Ce was added to YIG ($Y_3Fe_5O_{12}$) such that the composition became ($CeY_2Fe_5O_{12}$).
Figure 21:
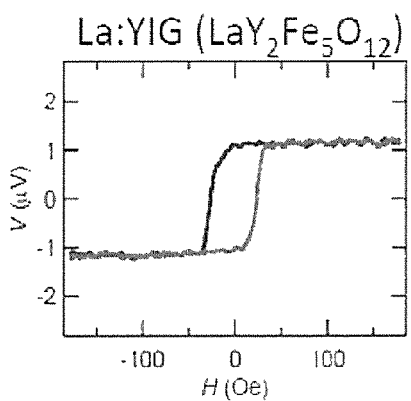
FIG. 21 is a graph showing the relationship between an external magnetic field and a thermoelectromotive force of a thermoelectric converter element using a magnetic film 2 in which an impurity of La was added to YIG ($Y_3Fe_5O_{12}$) such that the composition became ($LaY_2Fe_5O_{12}$).

The results are shown in FIGS. 19 to 21.

As is apparent from FIGS. 19 to 21, the largest thermoelectromotive force signal was measured in the case where X=Bi. For the samples where X=Ce and La, larger thermoelectromotive forces could be obtained as compared to YIG that had not been doped with an impurity as shown in FIG. 16. In other words, effects of enhancing the thermoelectromotive force were clearly obtained in cases where an impurity other than Bi had been substituted for the Y sites.

This experiment revealed that an impurity X should preferably be substituted for the Y sites in order to obtain a large thermoelectromotive force. Particularly, it was found that X should preferably be Bi.

Thus, the aforementioned examples illustrate that a thermoelectric converter element can be configured with a thin film of a polycrystalline magnetic insulator produced by a simple process of coating and sintering. It was found that the area of the thermoelectric converter element of Example 1 can further be increased with ease and that a thermoelectric converter element having high productivity can be achieved.

<Increase of the Thermoelectric Effect Due to the Phonon Drag Effect of the Spin Currents>

In the experiments illustrated in FIGS. 9 to 11, a temperature difference ΔT=3 K was applied between the upper surface and the bottom surface of the element, and a thermoelectromotive force was measured. Meanwhile, the film thickness $t_{YIG}$ of the magnetic insulator (Bi:YIG) layer on the GGG substrate having a thickness $t_{GGG}$=0.7 mm was as thin as 65 nm Therefore, a temperature difference $\Delta T_{YIG}$ applied to a magnetically insulating portion (film thickness portion of Bi:YIG) in which spin currents are thermally driven is supposed to be about several mK even at the highest estimate and to be extremely small. Nevertheless, according to the experiment results shown in FIG. 10, the thermoelectromotive force was measured on the order of μV. This experiment result showing a relatively large thermoelectromotive force strongly suggests contribution of "phonon drag effect," in which the thermoelectric effect is enhanced through interaction with phonons in the substrate, in addition to the spin Seebeck effect in the electrode 3/the magnetic film 2.

The phonon drag refers to a phenomenon in which spin currents in a structure of an electrode and a magnetic film interact non-locally with phonons of an overall element including a substrate (Reference: Applied Physics Letter 97, 252506). In consideration of this phonon drag process, spin currents in a very thin film as in Example 1 are sensitive to a temperature distribution in a substrate that is much thicker than the thin film, through the non-local interaction with the phonons. Therefore, the effective thermoelectric effects greatly increase.

Figure 22:
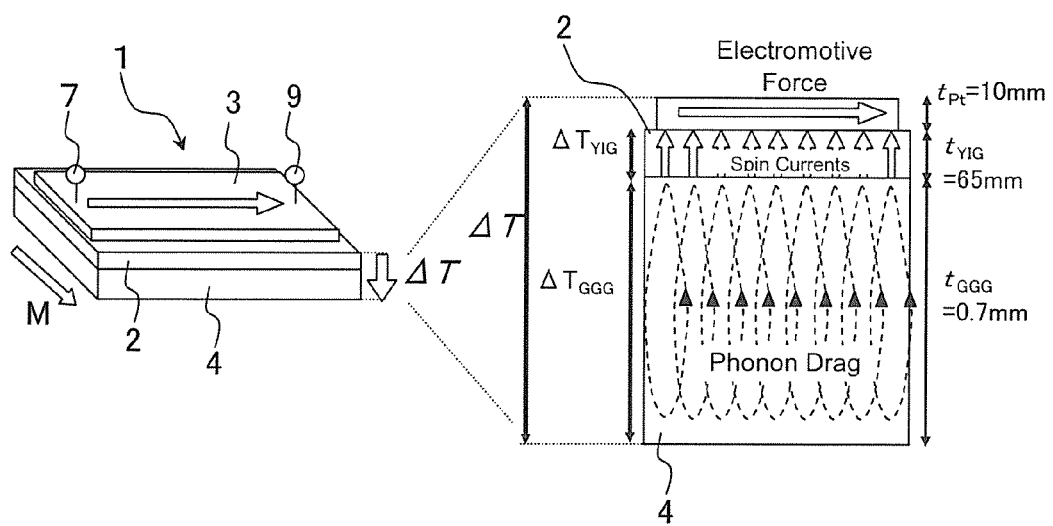
FIG. 22 is a diagram explanatory of the phonon drag effect of spin currents in a thermoelectric converter element 1.

Specifically, as shown in FIG. 22, not only the temperature difference $\Delta T_{YIG}$ applied to a thin magnetic insulator (film thickness portion of Bi:YIG), but also the temperature difference $\Delta T_{GGG}$ applied to a thick substrate contributes to the thermal driving of the spin currents. As a result, a larger thermoelectromotive force is generated in the electrode.

While validation of the fundamental principle of such a phonon drag effect has been reported, there have been no specific proposals for methods of designing large-area and low-cost thermoelectric devices using this effect. In the structure of the present invention, use of this phonon drag effect allows a thermoelectric conversion device to be mounted merely by depositing a thin structure of an electrode and a magnetic film that has a thickness of 100 nm or less on an inexpensive non-magnetic substrate. Therefore, costs for raw materials and other manufacturing costs may remarkably be reduced as compared to a case where a bulk magnetic material or the like is used. In addition, coating is used for a production process of a magnetic insulator film as in Example 1. Accordingly, large-area devices can be manufactured with high productivity.

Most of non-magnetic substrate materials can be produced at cost per volume that is not more than 1/10 of those of crystalline magnetically insulating materials such as YIG. Therefore, when a low-cost thermoelectric element using the phonon drag effect is designed, it is preferable for the thickness ($t_{YIG}$) of the magnetic material not to be more than 1/10 of the total thickness of the electrode and the substrate.

The experiment results of FIG. 12 suggest that high thermoelectric performance cannot be obtained if the thickness ($t_{YIG}$) of the magnetic material is excessively small. Therefore, $t_{YIG}$ should preferably be at least 50 nm.

(Preferable Power Generation Method)

When power is actually generated with use of a thermoelectric converter element comprising a stacked structure of a substrate, a magnetic insulator film, and the like as describe above, a temperature difference is applied to the element while one surface of the element is used for a high-temperature side, whereas the other surface of the element is used for a low-temperature side. For example, one surface of the element (the high-temperature side) is brought close to a heat source having a high temperature and is thus set at a temperature $T_H$. The other surface of element (the low-temperature side) is air-cooled or water-cooled as needed and set at a temperature $T_L$. Thus, a temperature difference $\Delta T = T_H - T_L$ is generated.

At that time, if the temperature of the magnetic insulator portion (magnetic film 2) exceeds the Curie temperature $T_C$ in a thermoelectric converter element according to the present invention, the spin Seebeck effect is impaired. As a result, an operation for power generation cannot be performed. Therefore, when thermoelectric power generation is performed with use of the element shown in FIG. 9, it is preferable to use a surface located away from the magnetic insulator (the lower surface of the substrate in FIG. 9; the surface on which no magnetic film is formed) for a high-temperature side and use a surface located near the magnetic insulator film (the upper surface of the substrate in FIG. 9; the surface on which the magnetic film is provided) for a low-temperature side. In order to ensure the operation for thermoelectric power generation by the aforementioned temperature difference application method, at least the low-temperature side should not exceed the Curie temperature of the magnetic insulator such that $T_L < T_C$. However, the high-temperature side may exceed the Curie temperature if the low-temperature side can properly be cooled so as to meet the above conditions. Therefore, the conditions may be such that $T_L < T_C < T_H$. Use of such a temperature difference application method makes it easier to apply an element of the present invention to a high-temperature region.

Example 2

In Example 1, an MOD method is used to deposit the magnetic film 2. In this case, high-temperature sintering is required for crystallization. Therefore, when the substrate 4 is made of a material that is likely to be decomposed at temperatures not more than a sintering temperature, such as plastics, then deposition is difficult to be performed. Additionally, the thickness and the number of layers are difficult to be increased because deposition is performed by spin-coating. Thus, in Example 2, deposition of the magnetic film 2 was attempted with use of an aerosol deposition method (AD method; for details of the AD method, see, e.g., Journal of the Surface Science Society of Japan, Vol. 25, No. 10, pp. 635-641), which can achieve high-speed thick film growth of a magnetic material.

Figure 23:
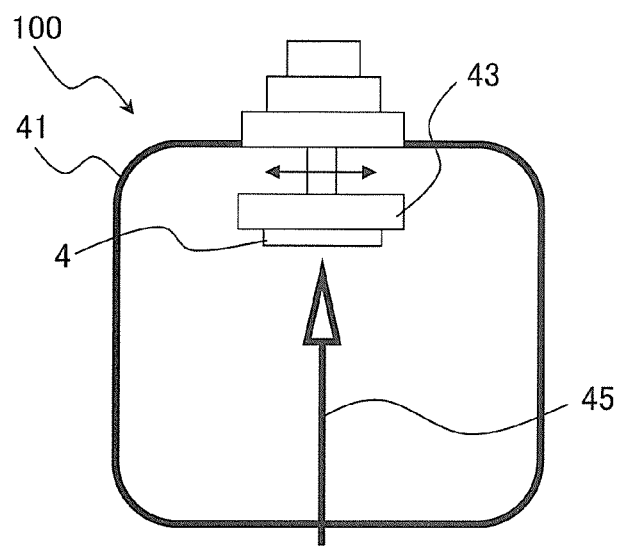
FIG. 23 is a schematic diagram of an apparatus 100 used for an AD method (aerosol deposition method).

In this example, a film of yttrium iron garnet (with composition of $Bi_{0.5}Y_{2.5}Fe_5O_{12}$ in this example) in which Bi had been substituted for part of the Y sites was deposited as a magnetic film 2 on a substrate 4 with an apparatus illustrated in FIG. 23 by an AD method.

Specifically, Bi:YIG particulates having an average diameter of about 800 nm that had been manufactured by KCM Corporation were prepared as a Bi:YIG material. Those Bi:YIG particulates were packed into an aerosol generation container, and the substrate 4 is fixed on a holder 43 in a deposition chamber 41.

Then the pressure of the deposition chamber was reduced to about 100 Pa in that state by a rotary pump. At the same time, an oxygen gas was supplied to the aerosol generation container so that a pressure difference was generated between the deposition chamber and the aerosol generation container. Thus, the Bi:YIG particulates were drawn into the deposition chamber and blown onto the substrate 4 through a nozzle 45. The blown particulates collided with the substrate at a speed of about 300 m/s. The collision energy at that time allowed the particulates to be ground and re-coupled, so that Bi:YIG polycrystal was formed on the substrate. A surface of the substrate was scanned two-dimensionally to deposit a uniform Bi:YIG film on the substrate with a film thickness of 5 μm.

In this example, the film properties were examined with varying an incidence angle of the material particulates to the substrate. As a result, it was found that an "oblique incidence method" of emitting the particulates obliquely with respect to the surface of the substrate is particularly preferable for forming a thermoelectric converter element.

Figure 24:
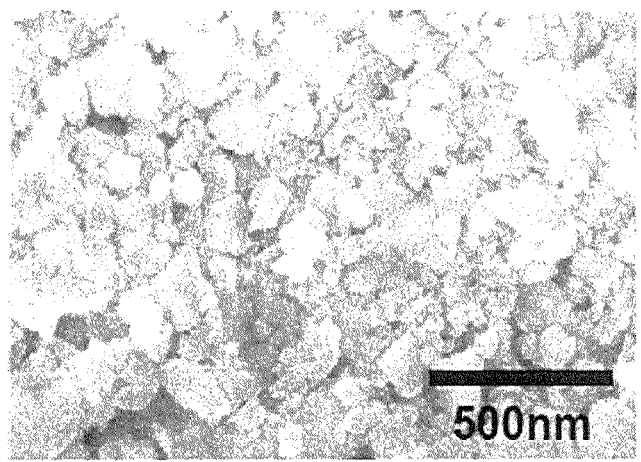
FIG. 24 is a diagram modeling a SEM image of a surface of a Bi:YIG film produced by an AD method.

In a general method of emitting the material particulates perpendicularly to the surface of the substrate (FIG. 23), particulates are not sufficiently crushed upon collision with the substrate. Those "non-ground particles" are drawn into the film as they are. As a result, defects that would be a source for scattering the spin currents increase. Furthermore, as shown in FIG. 24, which models a scanning electron microscope (SEM) image of the Bi:YIG surface, the bonding between crystal grains was weak, and there was found a problem that a dense film could not be formed. It was found from the material evaluations and experiments that, with such a film, the characteristic length in which spin currents (magnons) can propagate (which corresponds to $t_c$) is greatly reduced and that the thermoelectric conversion performance cannot be obtained.

Figure 25:
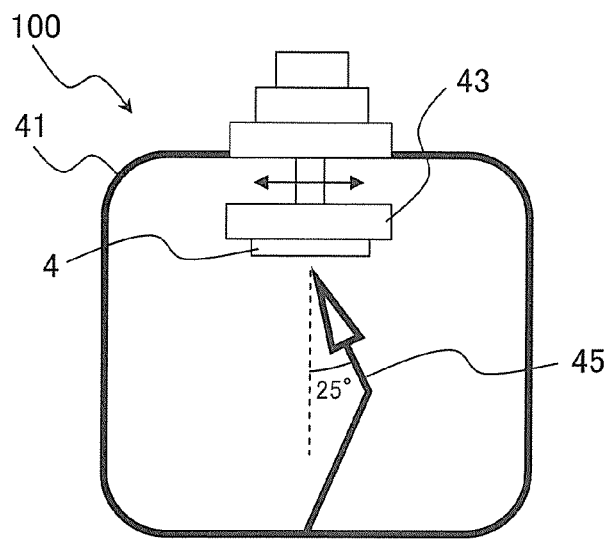
FIG. 25 is a schematic diagram of an apparatus 100 used for an AD method (aerosol deposition method).
Figure 26:
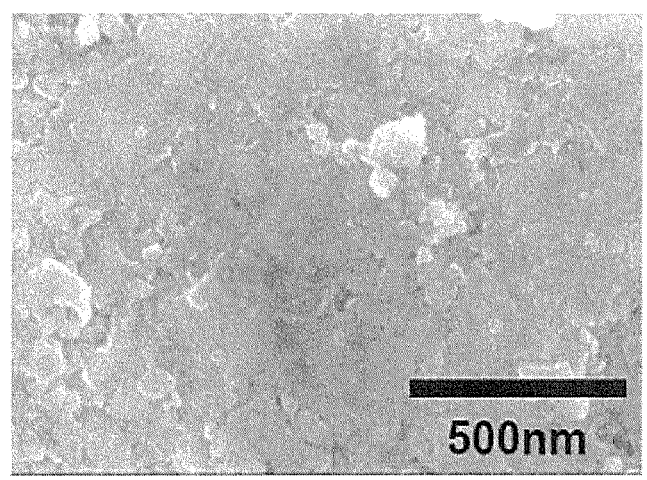
FIG. 26 is a diagram modeling a SEM image of a surface of a Bi:YIG film produced by an AD method.

On the other hand, it was confirmed that, with an "oblique incidence method" of emitting the material particulates with an inclined nozzle (FIG. 25), a dense and favorable film can be obtained with less defects as shown in FIG. 26, which models a SEM image. In this example, the nozzle 45 was fixed while it was inclined at 25 degrees from the vertical direction. Thus, the raw material was ejected and deposited in an oblique direction toward the substrate 4. With this oblique incidence method, the particulates have a momentum in a direction of the film surface. Therefore, it is estimated that some etching effects are demonstrated so that non-ground particles (sources for scattering spin currents), which conceivably have low adhesion, are removed and that a dense film is formed by ground particles that are relatively homogeneous. Thus, a sufficiently long magnon propagation length (corresponding to $t_c$) can be obtained, and the thermoelectric conversion performance is improved.

Such etching effects become significant in a case of an inclination angle of 15 degrees or more. Nevertheless, if the inclination angle is greater than 40 degrees, the etching effects exceed the deposition effects. As a result, effective deposition is difficult to be performed. Accordingly, the inclination angle in the oblique incidence method should preferably be between 15 degrees and 40 degrees.

In the following experiment results, thermoelectric converter elements were configured by forming a Bi:YIG film in an oblique incidence method with an incidence angle of 25 degrees.

First, for production of a thermoelectric converter element, a surface of the Bi:YIG film was polished using an abrasive agent of alumina paste of alumina particulates having a diameter of 30 nm after deposition of the magnetic film 2. Then a Pt electrode having a thickness of 10 nm was deposited as an electrode 3 on the magnetic film 2 by a sputtering method.

Figure 27:
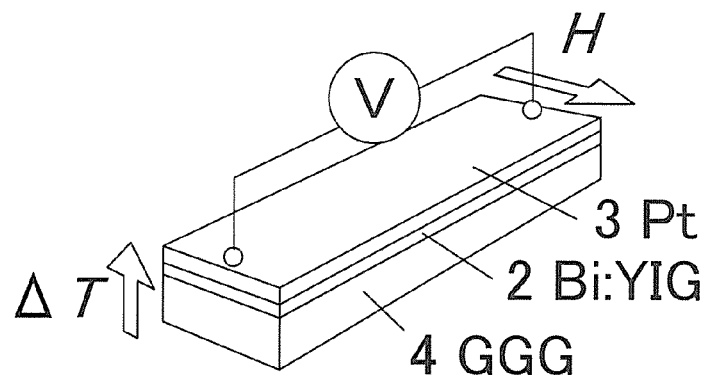
FIG. 27 is a perspective view showing a layered body of a Bi:YIG film/a GGG substrate produced by a Pt film/AD method.
Figure 28:
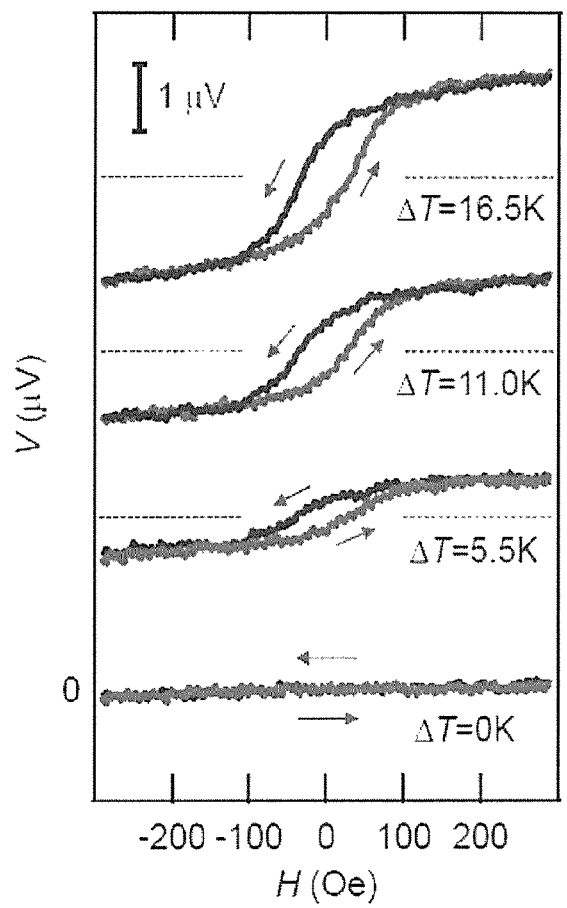
FIG. 28 is a graph showing the relationship between an external magnetic field and a thermoelectromotive force of a sample shown in FIG. 27 when a temperature gradient was varied.

FIG. 27 shows an element configuration of the produced thermoelectric converter element, and FIG. 28 shows the external magnetic field and the thermoelectromotive force. In this example, the element was produced with use of a GGG substrate having a thickness of 0.7 mm and a planar dimension of 3 mm×6 mm as the substrate 4. Temperature differences ΔT=5.5 K, 11.0 K, and 16.5 K were applied to this element. It was confirmed from a series of experiments that an electromotive force was generated between a terminal 7 and a terminal 9 of the Pt electrode (with an interval of 4 mm)

Figure 29:
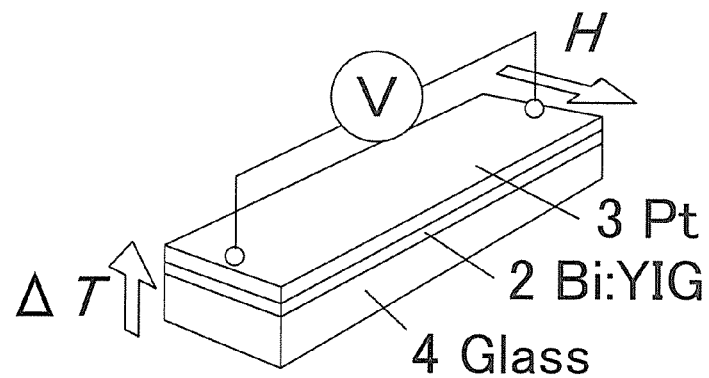
FIG. 29 is a perspective view showing a layered body of a Bi:YIG film/a glass substrate produced by a Pt film/AD method.
Figure 30:
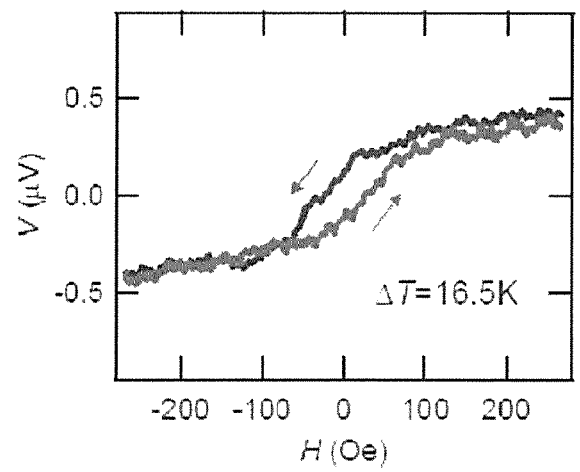
FIG. 30 is a graph showing the relationship between an external magnetic field and a thermoelectromotive force of a sample shown in FIG. 29.

Furthermore, as shown in FIG. 29, the same thermoelectric converter element was mounted on a glass substrate having a thickness of 0.5 mm and a planar dimension of 3 mm×6 mm When an external magnetic field was applied to the element, it was confirmed that a thermoelectromotive force was generated in a case where ΔT=16.5 K as shown in FIG. 30. No large differences are seen in hysteresis characteristics between the result of FIG. 28 and the result of FIG. 30. Therefore, it is suggested that an AD method does not greatly degrade the film properties of the magnetic film even on a low-cost substrate made of an amorphous material or the like.

The above experiment results reveal that an oblique incidence deposition of material particulates is effective in forming a favorable magnetic film that does not inhibit spin currents from propagating in a thermoelectric converter element. Instead of deposition using one nozzle arranged obliquely as described above, a plurality of nozzles including deposition nozzles and etching nozzles may be used concurrently so that raw materials are ejected from the respective nozzles to form a magnetic film. In such a case, it is preferable to arrange at least one of etching nozzles with an inclination angle of 15 degrees or more.

<Formation of a Flexible Thermoelectric Element Based upon Example 2>

Use of the aforementioned AD method allows a thermoelectric element to be formed on a flexible substrate made of an organic resin material because the AD method does not require high-temperature annealing. Therefore, it is possible to form a thermoelectric converter element having flexibility.

Production of a flexible element using a substrate having flexibility was attempted. First, a polyimide substrate manufactured by Ube Industries, Ltd. was prepared as a substrate 4.

Next, as with Example 1, a film of yttrium iron garnet (with composition of $BiY_2Fe_5O_{12}$; Bi:YIG) in which Bi had been substituted for part of the Y sites was deposited as a magnetic film 2 on the substrate 4 by an AD method.

Specifically, Bi:YIG particulates having a diameter of 500 nm that had been manufactured by KCM Corporation were prepared as a Bi:YIG material. Those Bi:YIG particulates were packed into an aerosol generation container, and the polyimide substrate was fixed on a holder in a deposition chamber.

Then the pressure of the deposition chamber was reduced to about 100 Pa in that state by a rotary pump, so that a pressure difference was generated between the deposition chamber and the aerosol generation container. Thus, the Bi:YIG particulates were drawn into the deposition chamber and blown onto the polyimide substrate through a nozzle that was inclined at 25 degrees based upon the aforementioned oblique incidence method. The blown particulates collided with the substrate at a speed of about 300 m/s. The collision energy at that time allowed the particulates to be ground and re-coupled, so that Bi:YIG polycrystal was formed on the substrate. A surface of the substrate was scanned two-dimensionally to deposit a uniform Bi:YIG film on the substrate with a film thickness of 0.1 mm Next, an Au electrode was formed as an electrode 3 on the magnetic film 2 by an electroless gold plating method. Specifically, a gold plating liquid containing a gold salt of sodium gold sulfite that had been manufactured by Hitachi Chemical Co., Ltd. was used, and a gold plating film of 50 nm was deposited with use of hypophosphite as a reducing agent.

By the above processes, a thermoelectric converter element 1 using polyimide as a substrate could be produced.

Thus, use of a plastic substrate such as polyimide, which has high flexibility, allowed formation of a flexible module, and a thermoelectric converter element that can be provided on heat sources having various shapes could be achieved.

Example 3

A thermoelectric converter element 1a according to the second embodiment was produced, and the thermoelectromotive force was evaluated. Specific procedures were as follows.

<Production of Samples>

First, a substrate (100) surface of gadolinium gallium garnet (GGG) manufactured by NTT Electronics Corporation was prepared as a substrate 4. The substrate had a thickness of 0.7 mm and a planar dimension of 2 mm×4 mm.

Next, yttrium iron garnet (with composition of $BiY_2Fe_4GaO_{12}$; hereinafter referred to as Bi, Ga:YIG) in which Bi had been substituted for part of the Y sites and Ga had been substituted for part of the Fe sites was deposited as a magnetic film 12 on the substrate 4 by a metal organic decomposition method (MOD method).

Specifically, a MOD solution with a mole fraction of Bi:Y:Fe:Ga=1:2:4:1 that had been manufactured by Kojundo Chemical Lab. Co., Ltd. was used. (Within this solution, raw metal materials were dissolved in acetic ester at a concentration of 3%.) This solution was applied onto the GGG substrate at a revolving speed of 1,000 rpm for 30 seconds by a spin-coating method. The substrate was dried with a hot plate of 150° C. for 5 minutes. Then the substrate was sintered at 720° C. in an electric furnace for 14 hours. Thus, a Bi, Ga:YIG film having a film thickness of about 160 nm was formed as a magnetic film 12 on the GGG substrate.

Figure 31:
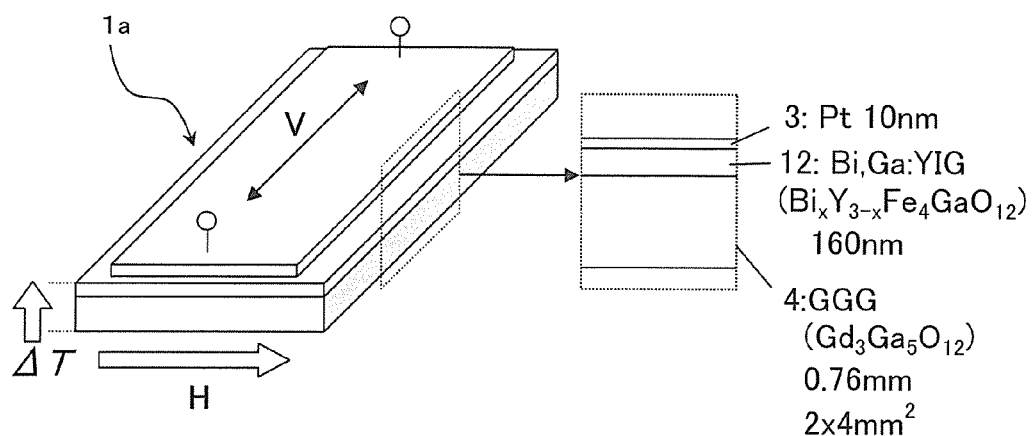
FIG. 31 is a diagram showing a thermoelectric converter element 1a of Example 3.

Next, a Pt electrode having a film thickness of 10 nm was deposited as an electrode 3 on the magnetic film 12 by a sputtering method. Thus, a thermoelectric converter element 1a comprising a structure illustrated in FIG. 31 was completed. A distance between the terminals 7 and 9 of the electrode 3 was set to be 4 mm <Evaluation of the thermoelectromotive force>

Next, a varying magnetic field H was applied to the produced thermoelectric converter element 1a within a range of −120 Oe to +120 Oe (1 Oe =79.577 A/m) with use of an electromagnet. Furthermore, a heat sink made of Cu was provided on one of an upper end and a lower end of the thermoelectric converter element 1, which was used for a low-temperature side. A heater was provided on the other end of the thermoelectric converter element 1a, which was used for a high-temperature side. A temperature difference ΔT=3 K was applied, and a voltage (thermoelectromotive force) V between the terminals 7 and 9 of the electrode 3 was measured.

Figure 32:
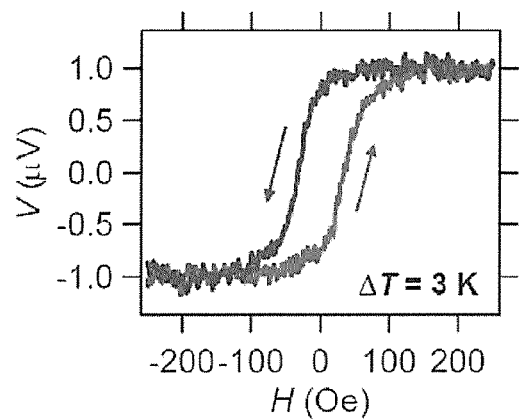
FIG. 32 is a graph showing the relationship between a magnetic field and a thermoelectromotive force of a thermoelectric converter element 1a of Example 3.

FIG. 32 shows the measured relationship between the magnetic field and the thermoelectromotive force.

As shown in FIG. 32, unlike the thermoelectric converter element 1, the magnetic film 12 (Bi, Ga:YIG) of the thermoelectric converter element 1a had coercivity. Therefore, the dependency of the thermoelectromotive force V upon the external magnetic field H demonstrated hysteresis. Specifically, it was found that, once the element was magnetized in one direction by the external magnetic field, it exhibited a finite thermoelectromotive force even though the magnetic field H returned to zero.

This result reveals that, if the magnetic film 12 is magnetized beforehand, a thermoelectromotive force can be generated by spontaneous magnetization of the magnetic film 12 even in an environment where the magnetic field is zero.

Example 4

A thermoelectric converter element 1a was produced while a glass substrate was used as a substrate 4 in Example 1, and the thermoelectromotive force was evaluated. Specific procedures were as follows.

<Production of samples>

First, a silica glass substrate (having a thickness of 0.5 mm and a planar dimension of 2 mm×4 mm) that had been manufactured by Optostar Ltd. was prepared as a substrate 4. A film of yttrium iron garnet (Bi:YIG) in which Bi had been substituted for part of the Y sites was deposited as a magnetic film 12 by a metal organic decomposition method (MOD method).

Specifically, a MOD solution with a mole fraction of Bi:Y:Fe=1:2:5 that had been manufactured by Kojundo Chemical Lab. Co., Ltd. was used. (Within this solution, raw metal materials were dissolved in acetic ester at a concentration of 3%.) This solution was applied onto the silica glass substrate at a revolving speed of 1,000 rpm for 30 seconds by a spin-coating method. The substrate was dried with a hot plate of 150° C. for 5 minutes. Then the substrate was sintered at 720° C. in an electric furnace for 18 hours. Thus, a Bi:YIG film having a film thickness of about 160 nm was formed as a magnetic film 12 on the silica glass substrate.

Figure 33:
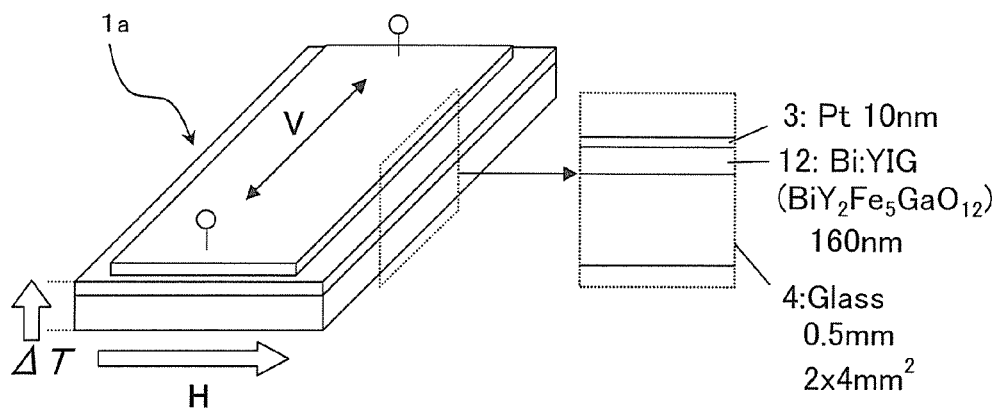
FIG. 33 is a diagram showing a thermoelectric converter element 1a of Example 4.

Next, an Au electrode having a film thickness of 50 nm was deposited as an electrode 3 on the magnetic film 12 by a sputtering method. Thus, a thermoelectric converter element 1a comprising a structure shown in FIG. 33 was completed. A distance between the terminals 7 and 9 of the electrode 3 was set to be 4 mm <Evaluation of the thermoelectromotive force>

Next, a varying magnetic field H was applied to the produced thermoelectric converter element 1a within a range of −120 Oe to +120 Oe (1 Oe=79.577 A/m) with use of an electromagnet. Furthermore, a heat sink made of Cu was provided on one of an upper end and a lower end of the thermoelectric converter element 1a, which was used for a low-temperature side. A heater was provided on the other end of the thermoelectric converter element 1a, which was used for a high-temperature side. A temperature difference $\Delta T=3$ K was applied, and a voltage (thermoelectromotive force) V between the terminals 7 and 9 of the electrode 3 was measured.

Figure 34:
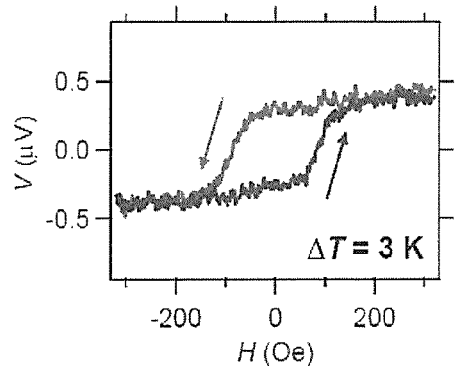
FIG. 34 is a graph showing the relationship between a magnetic field and a thermoelectromotive force of a thermoelectric converter element 1a of Example 4.

FIG. 34 shows the measured relationship between the magnetic field and the thermoelectromotive force.

As is apparent from FIG. 34, although the sample of Example 4 employed the same Bi:YIG film as in Example 1, the dependency of the thermoelectromotive force V upon the external magnetic field H demonstrated hysteresis. Specifically, once the element was magnetized in one direction by the external magnetic field, it exhibited a finite thermoelectromotive force even though the magnetic field H returned to zero. In other words, if the element is initialized at first (magnetized in a direction substantially perpendicular to a direction in which a thermoelectromotive force is derived), then a thermoelectromotive force can be generated by spontaneous magnetization of the magnetic film 12 even in an environment where the magnetic field is zero.

This is conceivably because the Bi:YIG film had coercivity as it was formed on the silica glass substrate unlike Example 1 in which the Bi:YIG film was formed on the GGG substrate.

The above result reveals that, when a Bi:YIG film is formed on a silica glass substrate, the Bi:YIG film has coercivity.

In the case of such a thermoelectric converter element formed on a glass substrate, cost reduction and area increment are facilitated. Therefore, such a thermoelectric converter element can be applied to power generation using temperature differences at a window or the like between the inside and the outside of a room and to a display and the like.

Example 5

Production of a thermoelectric converter element 1a was attempted by using polyimide as a substrate 4 and depositing a magnetic film 12 by an AD method. Specific procedures were as follows.

First, a polyimide substrate manufactured by Ube Industries, Ltd. was prepared as a substrate 4. A film of yttrium iron garnet (Bi, Ga:YIG) in which Bi had been substituted for part of the Y sites and Ga had been substituted for part of the Fe sites was deposited as a magnetic film 12 by an aerosol deposition method.

Specifically, Bi, Ga:YIG particulates having a diameter of 500 nm that had been manufactured by KCM Corporation were prepared as a Bi, Ga:YIG material.

Then those Bi, Ga:YIG particulates were packed into an aerosol generation container, and the polyimide substrate was fixed on a holder in a deposition chamber.

Subsequently, the pressure of the deposition chamber was reduced to about 100 Pa in that state by a rotary pump, so that a pressure difference was generated between the deposition chamber and the aerosol generation container. Thus, the Bi, Ga:YIG particulates were drawn into the deposition chamber and blown onto the polyimide substrate through a nozzle. The blown particulates were ground and re-coupled by the collision energy upon collision with the substrate. Thus, Bi, Ga:YIG polycrystal was formed on the substrate. A surface of the substrate was scanned two-dimensionally to deposit a uniform Bi, Ga:YIG film on the substrate with a film thickness of 0.1 mm.

Next, Au was formed as an electrode 3 on the magnetic film 12 by an electroless gold plating method. Specifically, a gold plating liquid containing a gold salt of sodium gold sulfite that had been manufactured by Hitachi Chemical Co., Ltd. was used, and a gold plating film of 50 nm was deposited with use of hypophosphite as a reducing agent. Thus, a thermoelectric converter element 1a could be produced.

Thus, use of a plastic substrate such as polyimide, which has high flexibility, could achieve a flexible thermoelectric converter element that can be provided on heat sources having various shapes.

Additionally, use of an AD method allows high-speed deposition of a thick film of 10 μm or more. A film with a film thickness around the characteristic thickness $t_c$ can be formed in a short period of time. Therefore, it is possible to achieve a thermoelectric converter element with high efficiency and high productivity.

Example 6

Production of a thermoelectric converter element 1b according to the third embodiment was attempted. Specific procedures were as follows.

First, a polyimide substrate was used as a substrate 4. A yttrium iron garnet Bi:YIG film (with composition of $BiY_2Fe_5O_{12}$) in which Bi had been substituted for part of the Y sites was deposited as a magnetic film 2 by an aerosol deposition method.

Specifically, Bi:YIG particulates having a diameter of 300 nm that had been manufactured by Toda Kogyo Corporation were prepared as a Bi:YIG material. Those Bi:YIG particulates were packed into an aerosol generation container, and the polyimide substrate was fixed on a holder in a deposition chamber.

Subsequently, the pressure of the deposition chamber was reduced to about 100 Pa in that state by a rotary pump, so that a pressure difference was generated between the deposition chamber and the aerosol generation container. Thus, the Bi:YIG particulates were drawn into the deposition chamber and blown onto the polyimide substrate through a nozzle. The blown particulates were ground and re-coupled by the collision energy upon collision with the substrate. Thus, Bi:YIG polycrystal was formed on the substrate. A surface of the substrate was scanned two-dimensionally to deposit a uniform Bi:YIG film on the substrate with a film thickness of 0.1 mm Next, Au was formed as an electrode 3 on the magnetic film 12 by an electroless gold plating method. Specifically, a gold plating liquid containing a gold salt of sodium gold sulfite that had been manufactured by Hitachi Chemical Co., Ltd. was used, and a gold plating film of 50 nm was deposited with use of hypophosphite as a reducing agent.

Next, deposition of the magnetic film 2 and formation of the electrode 3 were repeated so as to produce a power generation portion 5 comprising a four-layer stacked structure of Au/Bi:YIG.

As a result, a thermoelectric converter element 1b comprising a stacked structure of the magnetic films 2 and the electrodes 3 could be produced.

INDUSTRIAL APPLICABILITY

Examples of applications of the present invention include power sources for feeding a terminal, a sensor, or the like.

In the above embodiments, the thermoelectric converter elements 1, 1a, and 1b are applied to thermoelectric power generation for deriving a current or a voltage from a temperature gradient. However, the present invention is not limited to those embodiments. For example, the thermoelectric converter elements 1, 1a, and 1b may be used for a thermal sensor that detects a temperature, an infrared ray (by disposing an absorbing film or the like at a proximate location), or the like. In principle, the thermoelectric converter elements 1, 1a, and 1b may be used in a reversed manner to the aforementioned use as a Peltier element that generates a temperature gradient by supplying a current to the electrode 2 from an external source.

In the above embodiments, the magnetic film 2 is deposited on the substrate 4, and the electrode 3 is deposited on the magnetic film 2. Nevertheless, the positional relationship between the magnetic film 2 and the electrode 3 is not limited to the above embodiments. For example, an electrode 2 may be first deposited on a substrate 4, and a magnetic film 2 may be deposited on the electrode 2. In such a case, it is also possible to implement a thermoelectric converter element having the same function. This process, which deposits a thin electrode on a flat substrate, may be more advantageous in some implementation methods.

Furthermore, this application is based upon and claims the benefit of priority from Japanese patent application No. 2010-025797, filed on Feb. 9, 2010, and Japanese patent application No. 2011-192874, filed on Sep. 5, 2011, the disclosure of which is incorporated herein in its entirety by reference.

DESCRIPTION OF THE REFERENCE NUMERALS AND SIGNS 1 thermoelectric converter element
1a thermoelectric converter element
1b thermoelectric converter element
2 magnetic film
3 electrode
4 substrate
5 power generation portion
7 terminal
9 terminal
11 temperature gradient application portion
13 magnetization portion

The invention claimed is:

1. A thermoelectric converter element comprising:
a substrate;
a magnetic film provided on the substrate with a certain magnetization direction and formed of a magnetically insulating material;
an electrode provided on the magnetic film with a material exhibiting a spin-orbit interaction; and
a heat source for applying a temperature gradient in a direction perpendicular to a film surface of the magnetic film,
wherein the certain magnetization direction has a component in parallel to the film surface of the magnetic film, and a spin current is generated so as to flow toward the electrode when the temperature gradient is applied to the magnetic film,
wherein the magnetic film has a film thickness between $t_c/5$ and $5t_c$, where $t_c$ is a characteristic thickness which is three times a magnon diffusion length $\lambda$ of the magnetic film, $t_c=3\lambda$, and
when the temperature gradient is applied to the magnetic film in the direction perpendicular to the film surface of the magnetic film, the spin current is generated so as to flow from the magnetic film toward the electrode by a spin Seebeck effect of the magnetic film, and an electric current is generated in a direction perpendicular to the magnetization direction of the magnetic film by an inverse spin Hall effect of the electrode wherein the magnon diffusion length is from 10 micrometers to 50 micrometers.

2. The thermoelectric converter element as recited in claim 1, comprising a thermoelectromotive force output portion provided at two points on the electrode for outputting a thermoelectromotive force generated by the current as a potential difference between the two points.

3. The thermoelectric converter element as recited in claim 1, wherein the magnetic film has a film thickness that is not more than 1/10 of a film thickness of the substrate.

4. The thermoelectric converter element as recited in claim 1, comprising a magnetization portion for magnetizing the magnetic film in the certain magnetization direction.

5. The thermoelectric converter element as recited in claim 1, wherein the magnetic film has coercivity to cause spontaneous magnetization in the certain magnetization direction.

6. The thermoelectric converter element as recited in claim 1, wherein the magnetic film is formed of a material including yttrium iron garnet.

7. The thermoelectric converter element as recited in claim 1, wherein the magnetic film is formed of a material in which an impurity is substituted for part of an yttrium site of yttrium iron garnet.

8. The thermoelectric converter element as recited in claim 1, wherein the magnetic film comprises yttrium iron garnet doped with Bi.

9. The thermoelectric converter element as recited in claim 8, wherein the magnetic film comprises yttrium iron garnet doped with Bi that has a composition of $Bi_xY_{3-x}Fe_5O_{12}$ ($0.5 \leq x \leq 1.5$).

10. The thermoelectric converter element as recited in claim 1, wherein the magnetic film is formed of a material in which an impurity is substituted for part of an iron site of yttrium iron garnet so as to have enhanced coercivity.

11. A thermoelectric converter element comprising:
a substrate;
a power generation portion held on the substrate in which a plurality of magnetic films and a plurality electrodes are alternately stacked; and
a heat source for applying a temperature gradient in a direction perpendicular to a film surface of each of the magnetic films,
wherein each of the magnetic films has a certain magnetization direction and is formed of a magnetically insulating material,
wherein each of the electrodes has a material exhibiting a spin-orbit interaction,
wherein the certain magnetization direction has a component in parallel to the film surface of each of the magnetic films, and a spin current is generated so as to flow toward each of the electrodes when the temperature gradient is applied to the magnetic films,
wherein each of the magnetic films has a film thickness between $t_c/5$ and $5t_c$, where $t_c$ is a characteristic thickness which is three times a magnon diffusion length $\lambda$ of each of the magnetic films, $t_c=3\lambda$, and
when the temperature gradient is applied to the magnetic films in the direction perpendicular to the film surface of each of the magnetic films, the spin current is generated so as to flow from each of the magnetic films toward each of the electrodes by a spin Seebeck effect of each of the magnetic films, and an electric current is generated in a direction perpendicular to the magnetization direction of the magnetic films by an inverse spin Hall effect of the electrodes wherein the magnon diffusion length is from 10 micrometers to 50 micrometers.

12. A method of manufacturing a thermoelectric converter element, applying a solution containing a magnetic material on a substrate, heating the substrate to sinter the magnetic material, and depositing an electrode on the magnetic material so as to produce the thermoelectric converter element as recited in claim 1.

13. A method of manufacturing a thermoelectric converter element, blowing particles containing a magnetic material onto a substrate by an aerosol deposition method to form a magnetic film and depositing an electrode on the magnetic film so as to produce the thermoelectric converter element as recited in claim 1.

14. A thermoelectric conversion method applying a temperature gradient to the magnetic film of the thermoelectric converter element as recited in claim 1 to generate the spin current flowing from the magnetic film toward the electrode and generating an electric current in the direction perpendicular to the magnetization direction of the magnetic film by an inverse spin Hall effect in the electrode.

15. A thermoelectric conversion method applying a temperature difference while using, for a low-temperature side, a side of the substrate of the thermoelectric converter element as recited in claim 1 on which the magnetic film is provided and using another side of the substrate for a high-temperature side.

16. The thermoelectric converter element as recited in claim 1, wherein the magnetic film is formed of a polycrystalline magnetically insulating material.

* * * * *